United States Patent
Huang

(10) Patent No.: US 10,600,908 B2
(45) Date of Patent: Mar. 24, 2020

(54) HIGH VOLTAGE DEVICE AND MANUFACTURING METHOD THEREOF

(71) Applicant: RICHTEK TECHNOLOGY CORPORATION, Chupei, HsinChu (TW)

(72) Inventor: Tsung-Yi Huang, HsinChu (TW)

(73) Assignee: RICHTEK TECHNOLOGY CORPORATION, Zhubei, Hsinchu (*) Notice: Subject to any disclaimer, the term of this patent is extended or adjusted under 35 U.S.C. 154(b) by 0 days.

(21) Appl. No.: 15/937,741

(22) Filed: Mar. 27, 2018

(65) Prior Publication Data

US 2018/0337276 A1   Nov. 22, 2018

Related U.S. Application Data

(60) Provisional application No. 62/507,360, filed on May 17, 2017.

(30) Foreign Application Priority Data

Aug. 23, 2017   (TW) .............................. 106128637 A

(51) Int. Cl.
    *H01L 29/78* (2006.01)
    *H01L 29/08* (2006.01)
    (Continued)

(52) U.S. Cl.
    CPC ...... *H01L 29/7823* (2013.01); *H01L 29/0649* (2013.01); *H01L 29/0865* (2013.01); *H01L 29/0882* (2013.01); *H01L 29/1095* (2013.01); *H01L 29/404* (2013.01); *H01L 29/407* (2013.01); *H01L 29/4236* (2013.01); *H01L 29/42376* (2013.01); *H01L 29/66681* (2013.01); *H01L 29/66689* (2013.01); *H01L 29/66704* (2013.01); *H01L 29/7825* (2013.01); *H01L 29/7835* (2013.01); *H01L 21/266* (2013.01); *H01L 21/26513* (2013.01); *H01L 29/086* (2013.01); *H01L 29/42368* (2013.01)

(58) Field of Classification Search
    CPC .............. H01L 29/7823; H01L 29/404; H01L 29/66681; H01L 29/1095; H01L 29/407; H01L 29/0882; H01L 29/0865; H01L 29/0649; H01L 21/266; H01L 21/26513
    See application file for complete search history.

(56) References Cited

U.S. PATENT DOCUMENTS 9,159,828 B2   10/2015   Mallikarjunaswamy et al.
9,356,138 B2   5/2016    Fujii
(Continued)

*Primary Examiner* — David Vu
(74) *Attorney, Agent, or Firm* — Tung & Associates

(57) ABSTRACT

The present invention discloses a high voltage device and a manufacturing method thereof. The high voltage device is formed in a semiconductor substrate, and includes: a gate, a source, a drain, and at least one plug plate electrode. The plug plate electrode is in direct contact with the gate, and is electrically connected to the gate. The plug plate electrode extends downwards from the bottom of the gate to the semiconductor substrate, through a current vertical height of a conductive current when the high voltage is ON. The plug plate electrode is between the source and the drain in a lateral direction. The plug plate electrode includes a dielectric layer and a conductive layer.

20 Claims, 14 Drawing Sheets

(51) Int. Cl.
*H01L 29/40* (2006.01)
*H01L 29/06* (2006.01)
*H01L 29/10* (2006.01)
*H01L 29/66* (2006.01)
*H01L 29/423* (2006.01)
*H01L 21/265* (2006.01)
*H01L 21/266* (2006.01)

(56) References Cited

U.S. PATENT DOCUMENTS

2016/0149030 A1* 5/2016 Kim .................. H01L 29/7816
　　　　　　　　　　　　　　　　　　　　　257/337
2016/0276476 A1* 9/2016 Fang .................. H01L 29/4236

* cited by examiner

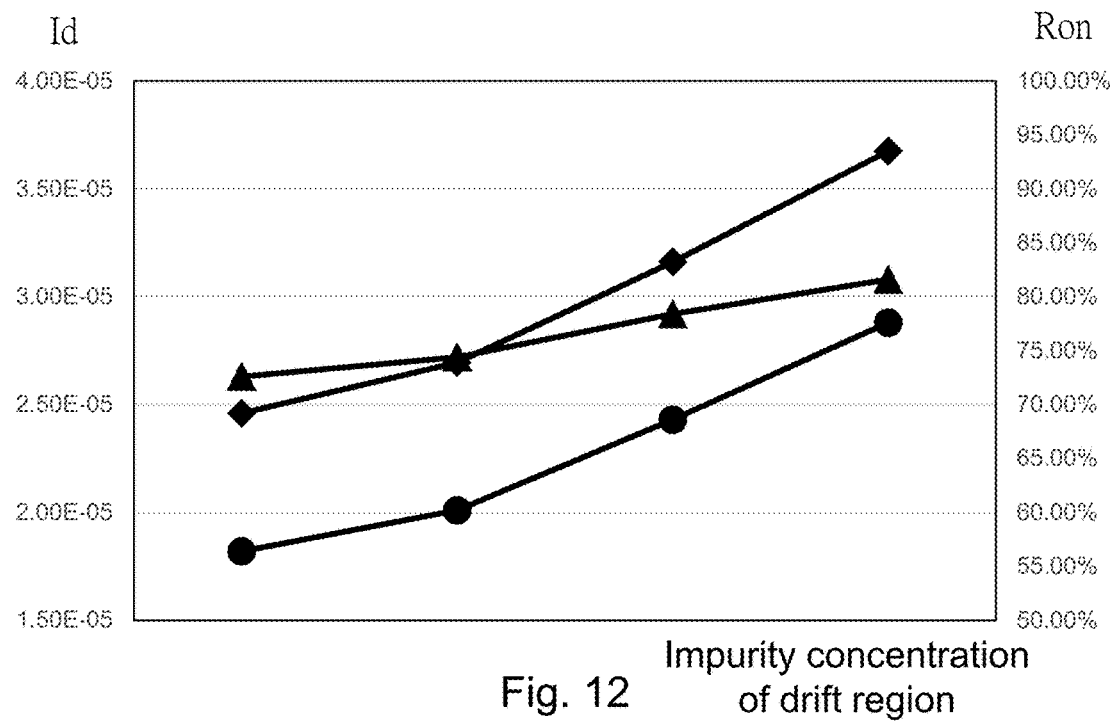
Fig. 12  Impurity concentration of drift region
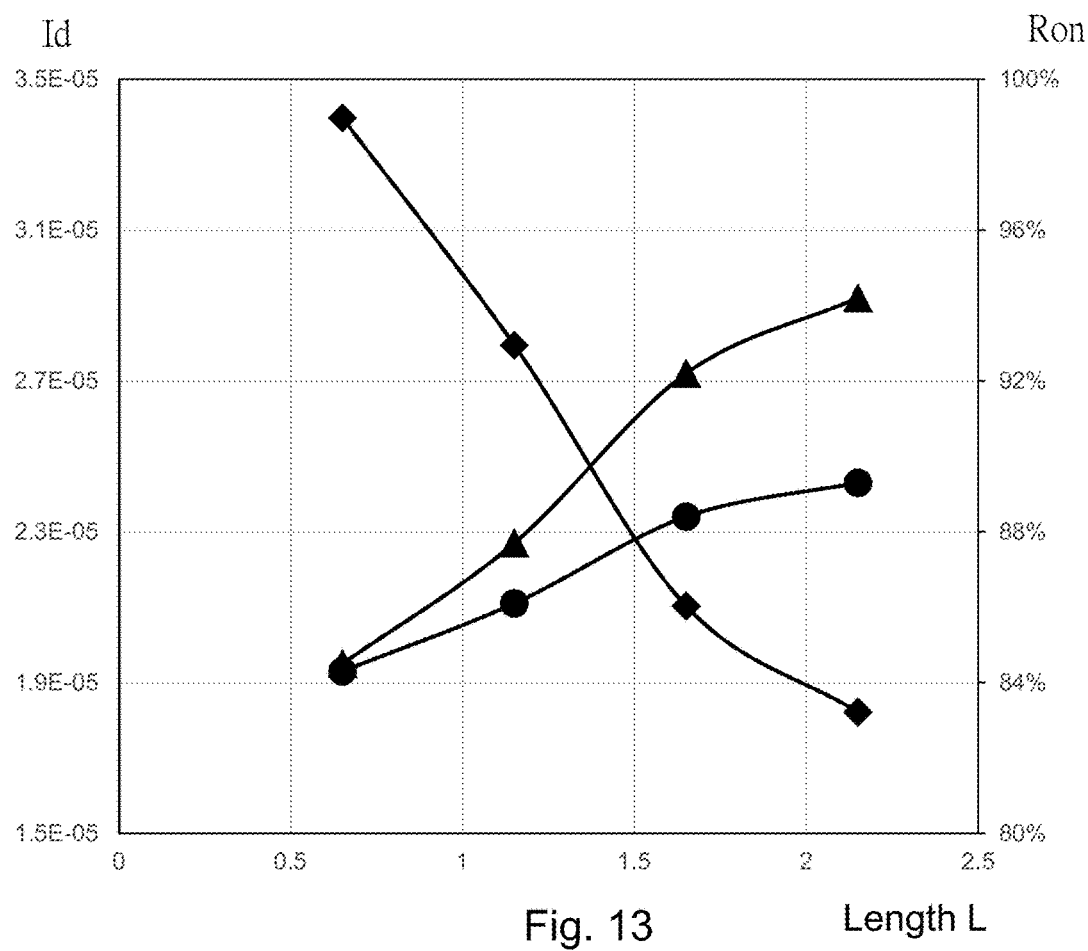
Fig. 13  Length L

HIGH VOLTAGE DEVICE AND MANUFACTURING METHOD THEREOF

CROSS REFERENCE

The present invention claims priority to U.S. Ser. No. 62/507,360, filed on May 17, 2017, and TW 106128637, filed on Aug. 23, 2017.

BACKGROUND OF THE INVENTION

Field of Invention

The present invention relates to a high voltage device and a manufacturing method thereof; particularly, it relates to such high voltage device having a low conductive resistance, and a manufacturing method thereof.

Description of Related Art

FIGS. 1A and 1B show schematic diagrams of a cross-sectional view and a three-dimensional (3D) view respectively of a prior art double diffused drain metal oxide semiconductor (DDDMOS) device 1. The DDDMOS device 1 is a high voltage device. As shown in FIGS. 1A and 1B, a P-type well 11a and an isolation structure 12 are formed in a semiconductor substrate 11 to define an operation region 100, wherein the isolation structure 12 is, for example, a shallow trench isolation (STI) structure (as shown) or a local oxidation of silicon (LOCOS) structure (not shown). A gate 13, a drift well 14, a drain 15 and a source 16 are formed in the operation region 100. The P-type well 11a may be the semiconductor substrate 11 itself, or formed by anion implantation process which implants P-type impurities to a defined region. The drift well 14, the drain 15 and the source 16 are formed by a lithography process (including a self-alignment process) and an ion implantation process, wherein the lithography process defines the implantation regions by a photoresist mask together with a self-alignment effect provided by all or a part of the gate 13 and the isolation region 12, and the ion implantation process implants N-type impurities to the implantation regions. The drain 15 and the source 16 are at different sides of and below the gate 13, and the drift well 14 partially interfaces with the bottom surface of the gate 13 at a side of the gate 13 closer to the drain 15 than the source 16. The DDDMOS device 1 is a high voltage device designed for applications requiring higher operation voltages. In the context of the present invention, a "high voltage device" indicates a device which is capable of withstanding a voltage over 5V on a drain thereof in normal operation. Typically, the DDDMOS device 1 has a drift region 14a (as indicated by a dashed frame shown in FIG. 1A) between the drain 15 and the gate 13, which separates the drain 15 and the gate 13. The drift region 14a has a length in a lateral direction (as indicated by a dashed arrow shown in the figure), wherein the length may be adjusted according to the operation voltage in normal operation. The length of the drift well 14a is required to be longer when the DDDMOS device 1 needs to sustain a relatively higher operation voltage, and thus a conductive resistance is increased. Therefore, the application range of the DDDMOS device 1 is limited under such condition with a higher conductive resistance.

FIGS. 2A and 2B show schematic diagrams of a cross-sectional view and a three-dimensional (3D) view respectively of a prior art double diffused drain metal oxide semiconductor (LDMOS) device 2. The LDMOS device 2 is a high voltage device. As shown in FIGS. 2A and 2B, an N-type well 21a and an isolation structure 22 are formed in a semiconductor substrate 21 to define an operation region 200, wherein the isolation structure 22 is, for example, the shallow trench isolation (STI) structure (not shown) or the local oxidation of silicon (LOCOS) structure (as shown). A gate 23, a field oxide region 24, a drain 25, a source 26, a body region 27 and a body contact 28 are formed in the operation region 100, wherein part of the gate 23 is located on the field oxide region 24. The N-type well 21a may be the semiconductor substrate 21 itself, or formed by an ion implantation process which implants N-type impurities to a defined region. The drain 25 and the source 26 are formed by a lithography process (including a self-alignment process) and an ion implantation process, wherein the lithography process defines the implantation regions by a photoresist mask together with a self-alignment effect provided by all or a part of the gate 23 and the isolation region 22, and the ion implantation process implants N-type impurities to the implantation regions. The body region 27 and the body contact 28 are formed by a lithography process (including a self-alignment process) and an ion implantation process, wherein the lithography process defines the implantation regions by a photoresist mask together with the self-alignment effect provided by all or a part of the gate 23 and the isolation region 22, and the ion implantation process implants P-type impurities to the implantation regions. The drain 25 and the source 26 are at different sides of and below the gate 23, and part of the N-type well 21a which separates the drain 25 and the gate 23, is defined as a drift region. Similar to the DDDMOS device 1, the LDMOS device 2 is a high voltage device designed for applications requiring higher operation voltages, and a length of the drift region in a lateral direction is required to be longer when the LDMOS device 2 needs to sustain a relatively higher operation voltage, and thus a conductive resistance is increased. Therefore, the application range of the LDMOS device 2 is limited under such condition with a higher conductive resistance.

In view of above, to overcome the drawbacks in the prior art, the present invention proposes a high voltage device having a reduced conductive resistance, and a manufacturing method thereof.

SUMMARY OF THE INVENTION

In one perspective, the present invention provides a high voltage device formed in a semiconductor substrate, wherein the semiconductor substrate has a top surface and a bottom surface opposite to the top surface in a vertical direction. The high voltage device includes: a gate, which is formed on and contacts the top surface of the semiconductor substrate, and is configured to operably control the high voltage device to be ON or OFF according to a gate voltage; a source with a first conductive type, which is formed in the semiconductor substrate, and is located beneath the top surface and contacts the top surface in the vertical direction, and is located adjacent to a first side of the gate in a lateral direction; a drain with the first conductive type, which is formed in the semiconductor substrate, and is located beneath the top surface and contacts the top surface in the vertical direction, and is located outside a second side opposite to the first side of the gate in the lateral direction, wherein the drain is separated from the gate by a drift region in the lateral direction; and at least one plug plate electrode, which contacts the gate and is electrically connected to the gate, and is located between the source and the drain in the lateral direction, the plug plate electrode extending downward from a bottom of the gate into the semiconductor substrate, wherein the downward extension extends by a vertical length which is longer than a current vertical height of a conductive current when the high voltage device is ON, wherein the current vertical height is a length of a vertical distribution of the conductive current; wherein the plug plate electrode includes a dielectric layer and a conductive layer, wherein the dielectric layer contacts the top surface, and the conductive layer is electrically connected to the gate.

In one perspective, the present invention also provides a manufacturing method of a high voltage device. The manufacturing method includes: providing a semiconductor substrate, which includes a top surface and a bottom surface opposite to the top surface in a vertical direction; forming a gate on the top surface of the semiconductor substrate, wherein the gate stacks on and contacts the top surface, and the gate is configured to operably control the high voltage device to be ON or OFF according to a gate voltage; forming at least one plug plate electrode, which contacts a bottom of the gate and is electrically connected to the gate; forming a source with a first conductive type in the semiconductor substrate, wherein the source is located beneath the top surface and contacts the top surface in the vertical direction, and is located adjacent to a first side of the gate in a lateral direction; and forming a drain with the first conductive type in the semiconductor substrate, wherein the drain is located beneath the top surface and contacts the top surface in the vertical direction, and is located outside a second side opposite to the first side of the gate in the lateral direction, wherein the drain is separated from the gate by a drift region in the lateral direction; wherein the plug plate electrode extends downward from the bottom of the gate into the semiconductor substrate, wherein the downward extension extends by a vertical length which is longer than a current vertical height of a conductive current when the high voltage device is ON, wherein the current vertical height is a length of a vertical distribution of the conductive current; wherein the plug plate electrode includes a dielectric layer and a conductive layer, wherein the dielectric layer contacts the top surface, and the conductive layer is electrically connected to the gate.

In one preferable embodiment, there are plural plug plate electrodes, wherein the plural plug plate electrodes are arranged in parallel in a width direction which is perpendicular to the lateral direction.

In one preferable embodiment, the high voltage device further includes a field oxide region, which stacks on and contacts the top surface in the vertical direction, and at least part of the gate relatively nearer to the drain than the source stacks right above and contacts at least part of the field oxide region.

In one preferable embodiment, the high voltage device further includes a high voltage well with the first conductive type, which is formed in the semiconductor substrate, and is located beneath the top surface and contacts the top surface in the vertical direction, wherein the source, the drain, the drift region, and at least part of the plug plate electrode are located in the high voltage well, wherein part of the high voltage well is used as the drift region; and a body region with the second conductive type, which is formed in the semiconductor substrate, and is located beneath the top surface and contacts the top surface in the vertical direction, wherein the source is located in the body region, wherein part of the body region is used as a channel region.

In one preferable embodiment, the plug plate electrode is entirely located in the high voltage well.

In one preferable embodiment, the high voltage device further includes a high voltage well with the second conductive type, which is formed in the semiconductor substrate, and is located beneath the top surface and contacts the top surface in the vertical direction, wherein part of the high voltage well is used as a channel region; and a drift well with the first conductive type, which is formed in the semiconductor substrate, and is located beneath the top surface and contacts the top surface in the vertical direction, wherein the drain is located in the drift well, wherein part of the drift well is used as the drift region.

In one preferable embodiment, the plug plate electrode is entirely located in the high voltage well.

The objectives, technical details, features, and effects of the present invention will be better understood with regard to the detailed description of the embodiments below.

BRIEF DESCRIPTION OF THE DRAWINGS

FIG. 12 shows a schematic diagram of characteristics of conductive current and conductive resistance versus impurity concentration of drift region of high voltage devices of the prior art and the present invention.

FIG. 13 shows a schematic diagram of characteristics of conductive current and conductive resistance versus length of the plug plate electrode of high voltage devices of the prior art and the present invention.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
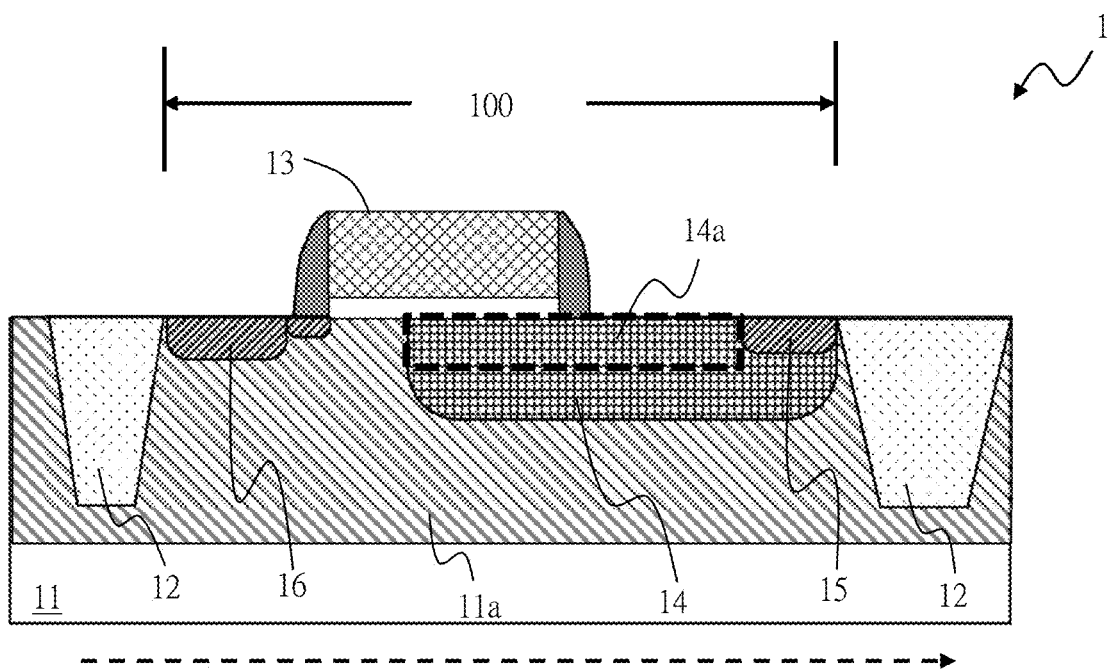
FIGS. 1A and 1B show schematic diagrams of a cross-sectional view and a three-dimensional (3D) view respectively of a prior art double diffused drain metal oxide semiconductor (DDDMOS) device 1.
Figure 1B:
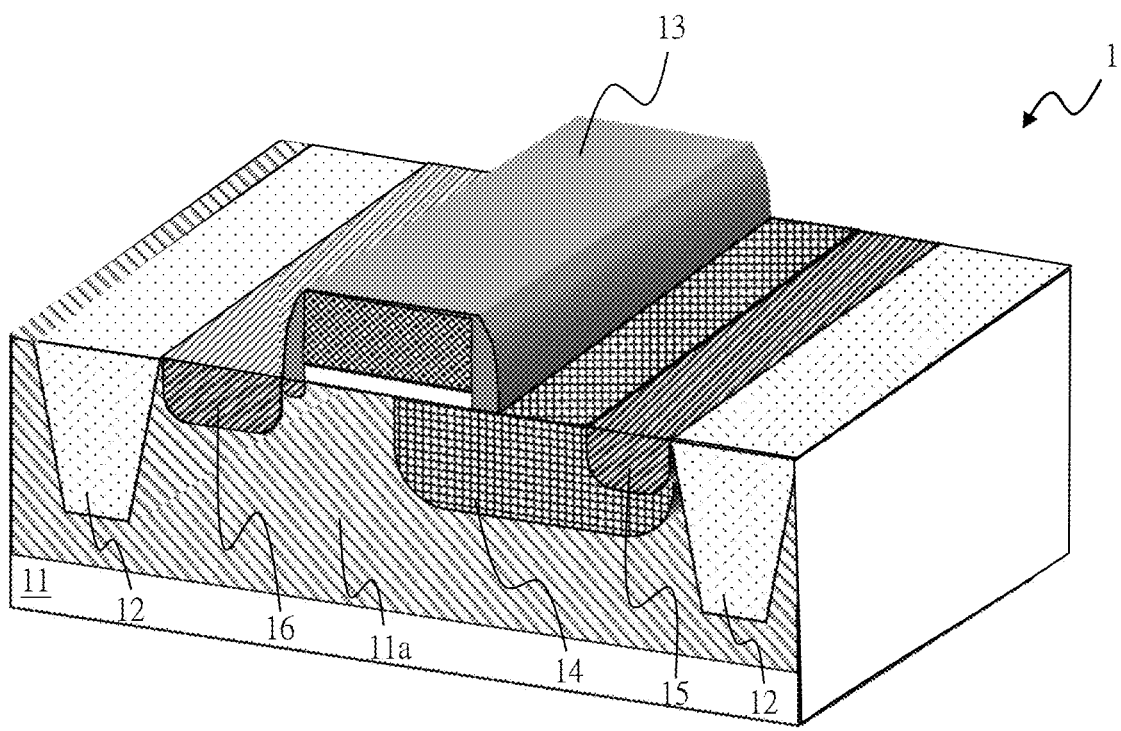
Figure 2A:
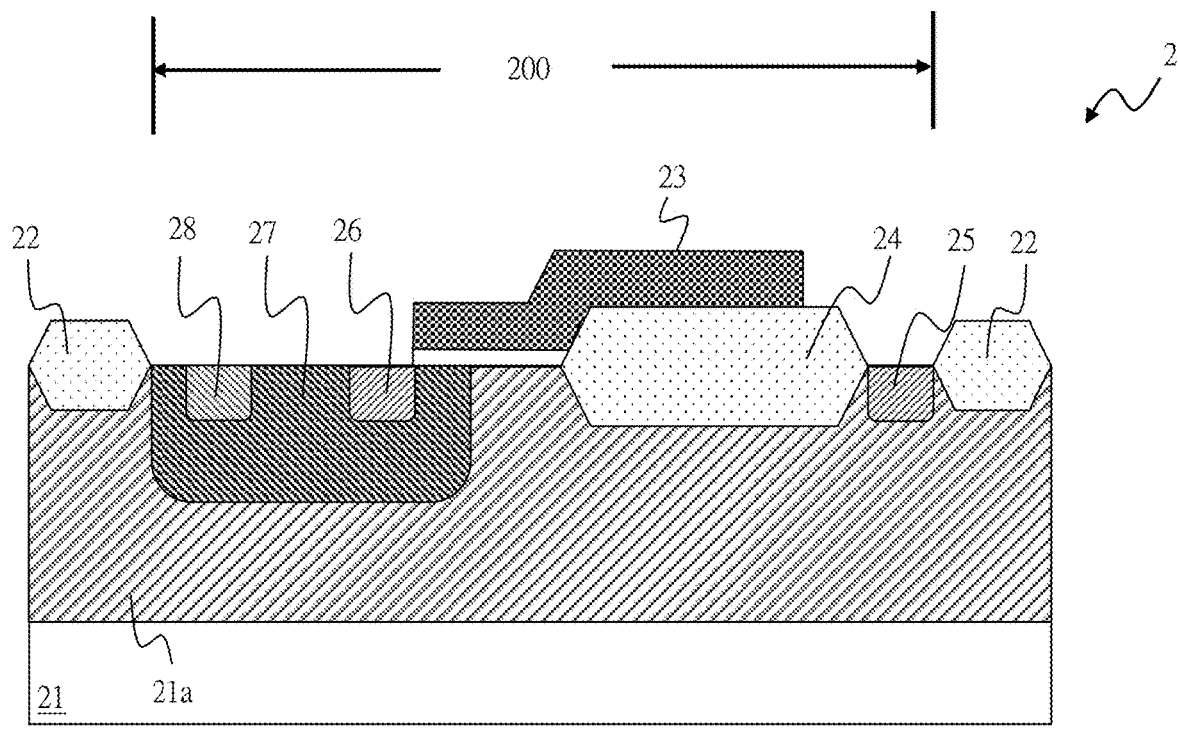
FIGS. 2A and 2B show schematic diagrams of a cross-sectional view and a three-dimensional (3D) view respectively of a prior art double diffused drain metal oxide semiconductor (LDMOS) device 2.
Figure 2B:
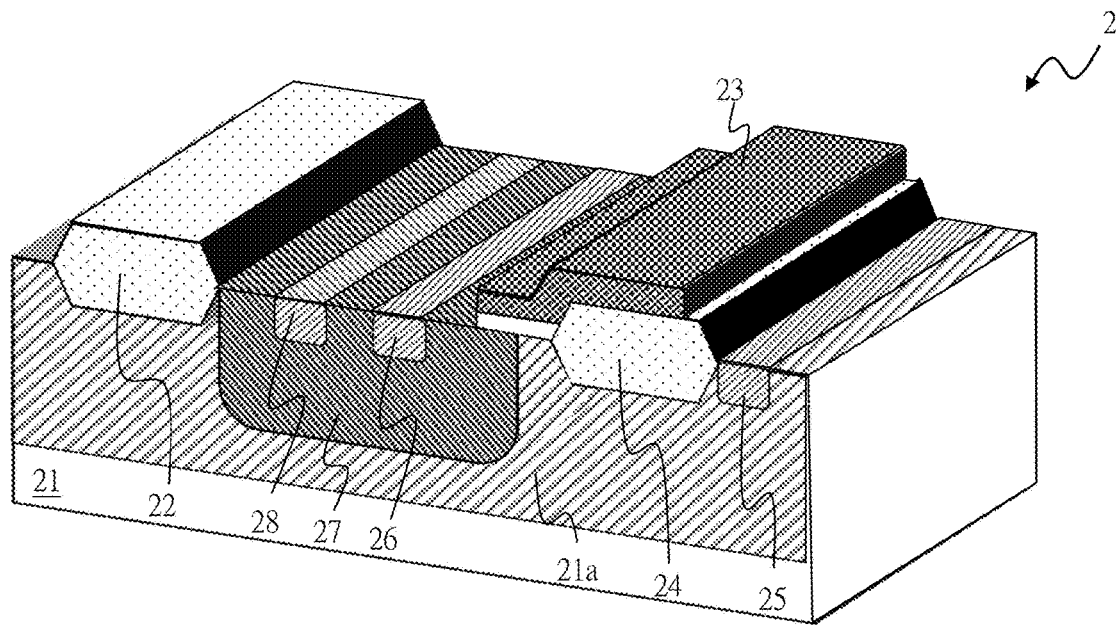
Figure 3A:
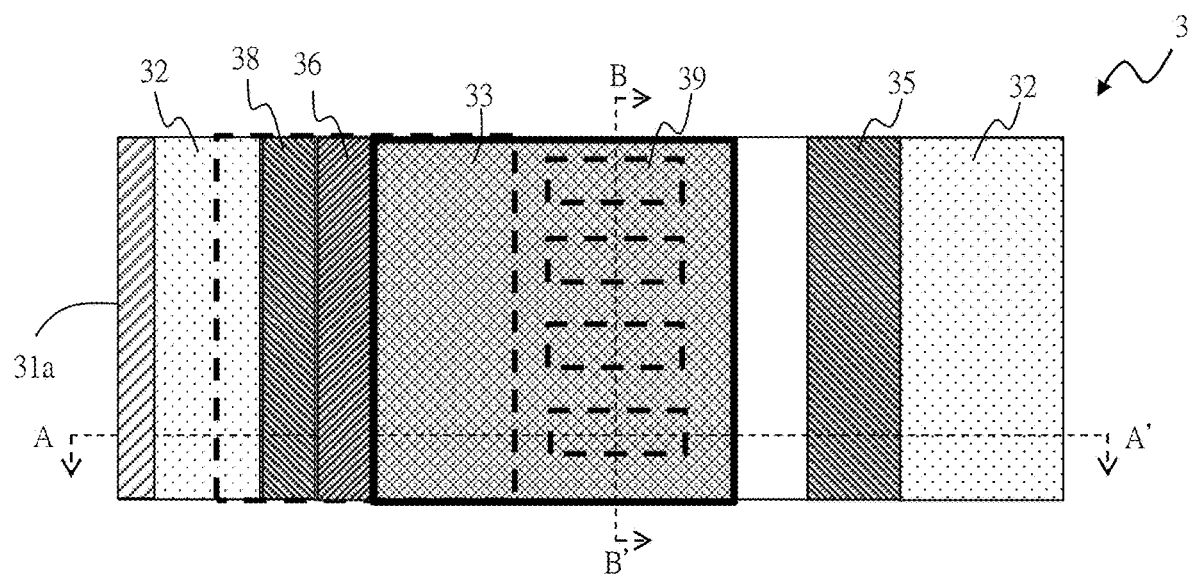
FIGS. 3A-3H show a first embodiment of the present invention.
Figure 3B:
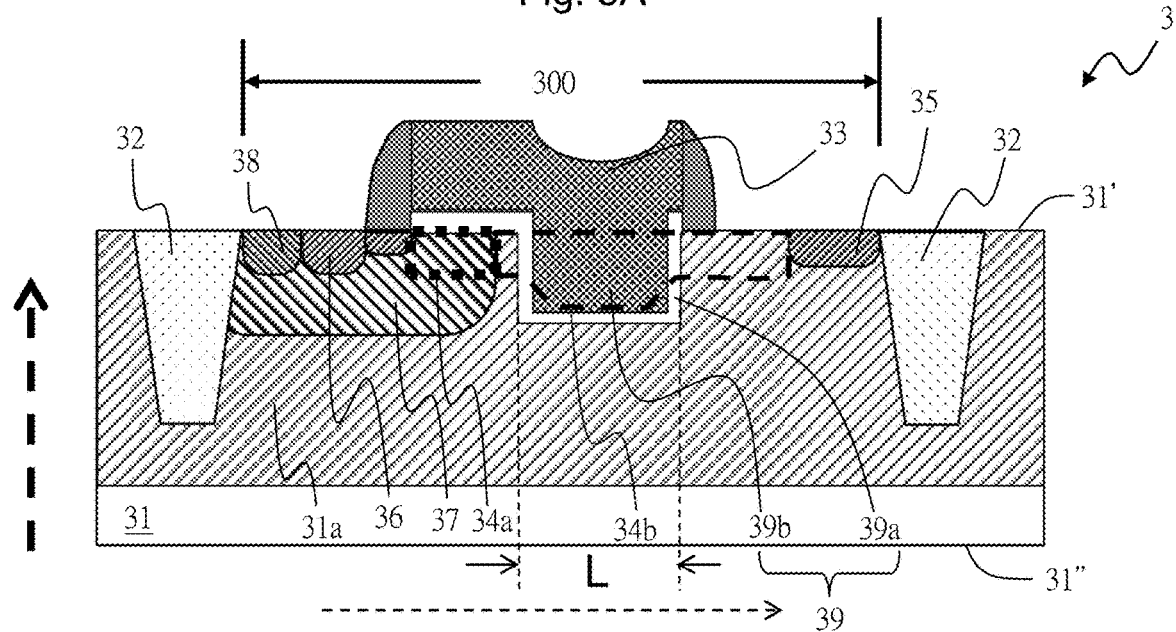
Figures 3C, 3D, 3E, 3F:
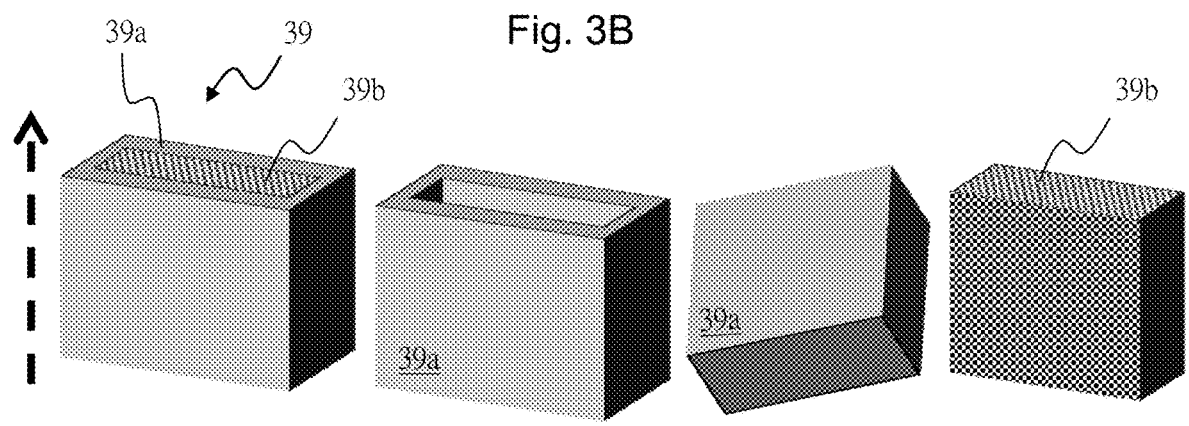
Figure 3G:
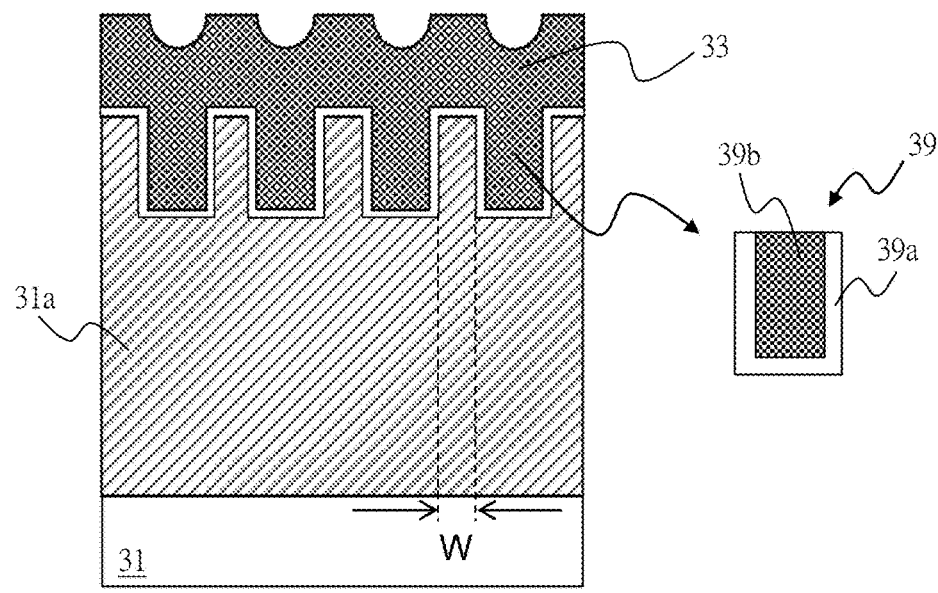

Please refer to FIGS. 3A-3H for a first embodiment according to the present invention. FIG. 3A shows a schematic diagram of a top view of a high voltage device 3. FIG. 3B shows a schematic diagram of a cross-sectional view along a cross-section line AA' shown in FIG. 3A, and FIG. 3G shows a schematic diagram of a cross-sectional view along a cross-section line BB' shown in FIG. 3A. First, a semiconductor substrate 31 is provided, which is for example but not limited to a P-type silicon substrate. Referring to FIGS. 3A and 3B, an isolation structure 32 is formed in the semiconductor substrate 31 to define an operation region 300. The isolation structure 32 is for example but not limited to a shallow trench isolation (STI) structure as shown in FIG. 3B, or in another embodiment, it can be a local oxidation of silicon (LOCOS) structure. Next, a high voltage well 31a, a gate 33, a drain 35, a source 36, a body region 37, a body contact 38, and at least one plug plate electrode 39 are formed in the semiconductor substrate 31. The high voltage well 31a, the drain 35, and the source 36 have a first conductive type, and the body region 37 and the body contact 38 have a second conductive type. The first conductive type is for example but not limited to N-type, or it can be P-type in another embodiment. The second conductive type is opposite to the first conductive type; when the first conductive type is N-type, the second conductive type is P-type, and when the first conductive type is P-type, the second conductive type is N-type.

The high voltage well 31a may be the semiconductor substrate 31 itself, or formed by anion implantation process which implants the first conductive type impurities to a defined region. The drain 35 and the source 36 are formed by a lithography process (including a self-alignment process) and an ion implantation process, wherein the lithography process defines the implantation regions by a photoresist mask together with a self-alignment effect provided by all or part of the gate 33 and the isolation structure 32, and the ion implantation process implants the first conductive type impurities to the implantation regions. The drain 35 and the source 36 are at different sides of and below the gate 33. The body region 37 and the body contact 38 are formed by a lithography process (including a self-alignment process) and an ion implantation process, wherein the lithography process defines the implantation regions by a photoresist mask together with a self-alignment effect provided by all or a part of the gate 33 and the isolation structure 32, and the ion implantation process implants the second conductive type impurities to the implantation regions. The high voltage device 3 has a drift region 34b (as indicated by a thin dashed frame shown in FIG. 3B) between the drain 35 and the gate 33, which separates the drain 35 and the gate 33. The drift region 34b has a length in a lateral direction (as indicated by a dashed arrow shown in FIG. 3B), wherein the length may be adjusted according to the operation voltage designed for normal operation.

The high voltage device 3 has a top surface 31' and a bottom surface 31" opposite to the top surface 31' in a vertical direction (as indicated by a bold dashed arrow shown in FIG. 3B). The high voltage device 3 includes: the high voltage well 31a, the gate 33, the source 36, the drain 35, the body region 37, the body contact 38, and at least one plug plate electrode 39. The gate 33 is formed on the top surface 31' of the semiconductor substrate 31, i.e., the gate 33 stacks on and contacts the top surface 31'; the gate 33 controls the high voltage device 3 to be ON or OFF according to a gate voltage. The source 36 with the first conductive type is formed in the semiconductor substrate 31. The source 36 is located beneath the top surface 31' and contacts the top surface 31' in the vertical direction. The source 36 is located adjacent to a first side (a left side of the gate 33 shown in FIGS. 3A and 3B) of the gate 33 in a lateral direction and below the gate 33 in the vertical direction.

The drain 35 with the first conductive type is formed in the semiconductor substrate 31, and is located beneath the top surface 31' and contacts the top surface 31' in the vertical direction. The drain 35 is located outside a second side (a right side of the gate 33 shown in FIGS. 3A and 3B) opposite to the first side of the gate 33 in the lateral direction, and below the gate 33 in the vertical direction. The drain 35 is separated from the gate 33 by the drift region 34b in the lateral direction, and the drain 35 does not contact the gate 33. The at least one plug plate electrode 39 contacts the gate 33 and is electrically connected to the gate 33; the plug plate electrode 39 extends downward from the bottom of the gate 33 into the semiconductor substrate 31. The downward extension extends by a vertical length which is longer than a vertical distribution (referring to as "current vertical height" hereinafter) of a conductive current when the high voltage device 3 is ON. The plug plate electrode 39 is located between the source 36 and the drain 35 and has a length L in the lateral direction. The plug plate electrode 39 includes a dielectric layer 39a and a conductive layer 39b, wherein the dielectric layer 39a contacts the top surface 31', and the conductive layer 39b is electrically connected to the gate 33.

The high voltage well 31a has the first conductive type. The high voltage well 31a is formed in the semiconductor substrate 31, and is located beneath the top surface 31' and contacts the top surface 31' in the vertical direction. The source 36, the drain 35, the drift region 34b, and at least part of the plug plate electrode 39 are located in the high voltage well 31a, wherein part of the high voltage well 31a is used as the drift region 34b. The body region 37 has the second conductive type. The body region 37 is formed in the semiconductor substrate 31, and is located beneath the top surface 31' and contacts the top surface 31' in the vertical direction. The source 36 is located in the body region 37, wherein part of the body region 37 is used as a channel region 34a (as indicated by a bold dashed frame shown in FIG. 3B).

When a gate voltage is applied on the gate 33 to turn ON the high voltage device 3, the channel region 34a is reversed to conduct current between the drain 35 and the source 36, and the drift region 34b is a region between the channel region 34a and the drain 35 where the conductive current flows through, as well known by those skilled in the art, so details thereof are omitted here. The "conductive current" in the context of this invention indicates a major current flowing between the drain 35 and the source 36 when the high voltage device 3 turns ON. The current vertical height of the conductive current extends from the top surface 31' downward. The plug plate electrode 39 has a same voltage level as the gate 33 because the plug plate electrode 39 is electrically connected to the gate 33, and extends downward from the bottom of the gate 33 into the semiconductor substrate 31 by a length longer than the current vertical height. Thus, when the high voltage device 3 is ON, more carriers can be induced in the drift region 34b to increase the conductive current, and the conductive resistance is reduced. That is, according to the present invention, when the high voltage device 3 turns ON, the plug plate electrode 39 can induce more carriers because of its voltage level, and thus the conductive current is higher than the prior art. From another perspective, it can be regarded as that the boundary of the drift region 34b extends lower to the interface between the high voltage well 31a and the plug plate electrode 39.

In one embodiment, the plug plate electrode 39 for example may be formed by a same process step of forming the gate 33. In this case, a recess is formed on the gate 33 as shown in FIG. 3B when a conductive layer of the gate is formed by a deposition process.

Figure 3H:
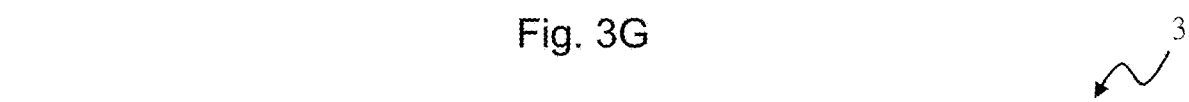

FIGS. 3C-3F show schematic diagrams of 3D view of the plug plate electrode 39 and the dielectric layer 39a and the conductive layer 39b thereof in various perspectives. As shown in the figures, the conductive layer 39b is exposed at an upper surface of the plug plate electrode 39, for contacting the gate 33 and being electrically connected to the gate 33. The dielectric layer 39a is formed to be a hollow cuboid without top surface, in the semiconductor substrate 31 between the drain 35 and the source 36 as shown in FIG. 3D. A bottom surface of the dielectric layer 39a contacts the semiconductor substrate 31 as shown in FIG. 3E, and the conductive layer 39b is filled inside the hollow space of the dielectric layer 39a; a schematic 3D diagram of the conductive layer 39b is shown as FIG. 3F. FIG. 3G shows a cross-sectional view along a cross-section line BB' in FIG. 3A. As shown in the figure, the plural plug plate electrodes 39 contact the bottom of the gate 33; each plug plate electrode 39 includes the dielectric layer 39a and the conductive layer 39b. In the width direction (as indicated by a dashed arrow shown in FIG. 3H), two neighboring plug plate electrodes 39 do not contact each and there is a spacing W in between. FIG. 3H shows a schematic diagram of a 3D view of the high voltage device 3, wherein the gate 33 with the plural plug plate electrodes 39 is shown to be separated from the semiconductor substrate 31 for purpose of better illustrating the feature of the present invention. The plural plug plate electrodes 39 are located entirely in the high voltage well 39, and insert into corresponding grooves 39h formed in the semiconductor substrate 31 respectively. The high voltage device 3 further includes a lightly doped region 36a with the first conductive type, which is located beneath the top surface 31' and contacts the top surface 31'. The lightly doped region 36a is adjacent to and contacts the source 36 and the high voltage well 31a.

Figure 4A:
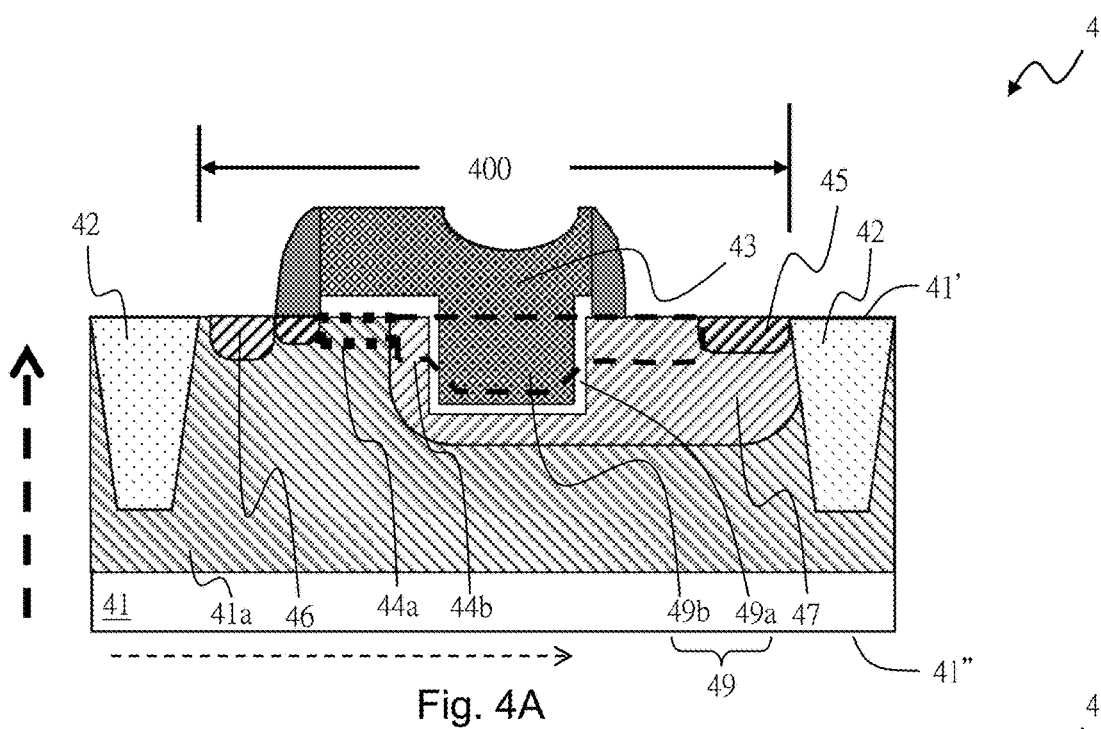
FIGS. 4A-4B show a second embodiment of the present invention.
Figure 4B:
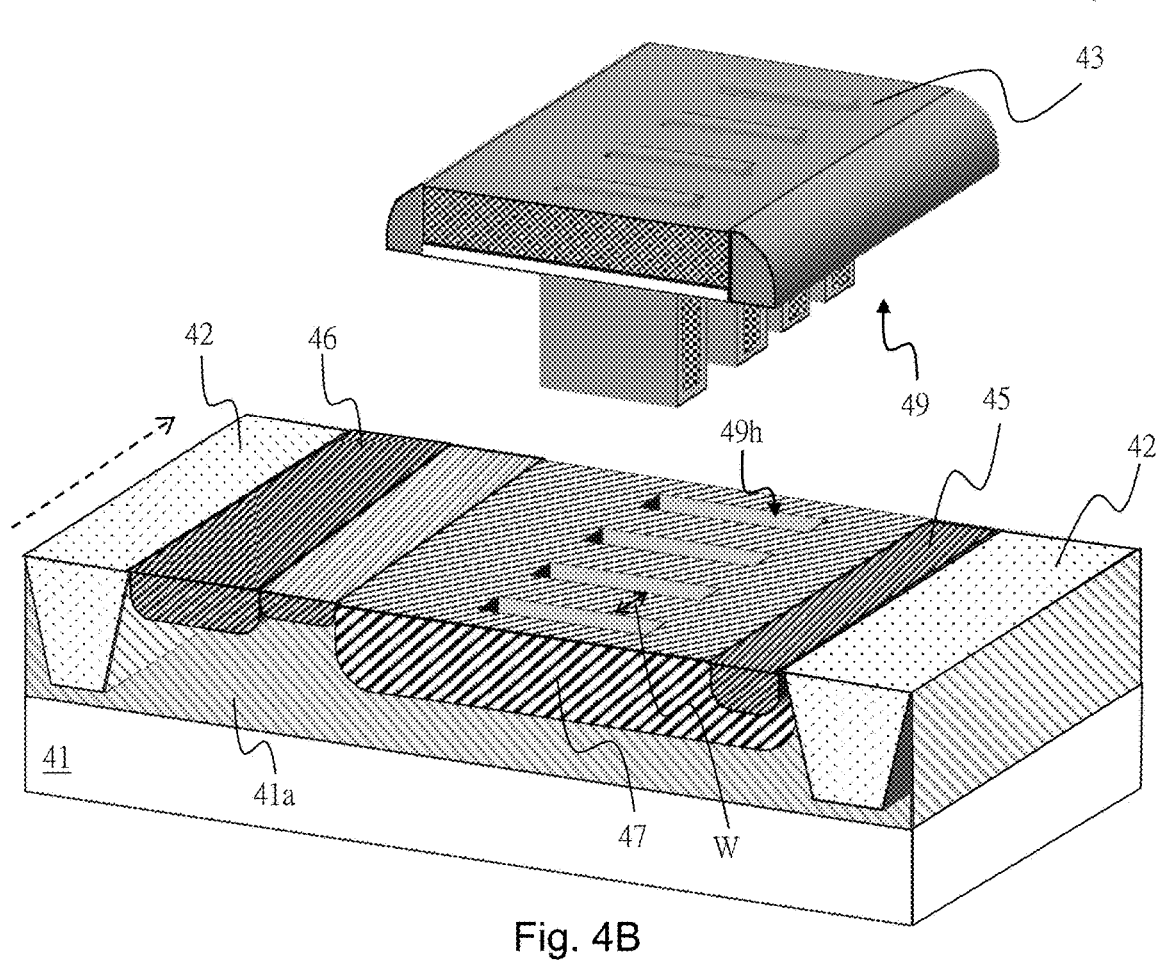

Please refer to FIGS. 4A-4B for a second embodiment according to the present invention. FIG. 4A shows a schematic diagram of a cross-sectional view of a high voltage device 4. FIG. 4B shows a schematic diagram of a 3D view of the high voltage device 4. Referring to FIGS. 4A and 4B, an isolation structure 42 is formed in a semiconductor substrate 41 to define an operation region 400. In one embodiment, the isolation structure 42 is for example but not limited to a shallow trench isolation (STI) structure as shown in FIGS. 4A and 4B; in another embodiment, it can be a local oxidation of silicon (LOCOS) structure. The high voltage device 4 has a top surface 41' and a bottom surface 41" opposite to the top surface 41'. The high voltage device 4 includes: a high voltage well 41a, a gate 43, a drain 45, a source 46, a drift region 47, and at least one plug plate electrode 49. The gate 43 is formed on the top surface 41' of the semiconductor substrate 41, and the gate 43 stacks on and contacts the top surface 41'; the gate 43 controls the high voltage device 4 to be ON or OFF according to a gate voltage applied on the gate 43. The source 46 with the first conductive type is formed in the semiconductor substrate 41. The source 46 is located beneath the top surface 41' and contacts the top surface 41' in the vertical direction. The source 46 is located adjacent to a first side (a left side of the gate 43 shown in FIGS. 4A and 4B) of the gate 43 in a lateral direction and below the gate 43 in the vertical direction.

The drain 45 with the first conductive type is formed in the semiconductor substrate 41, and is located beneath the top surface 41' and contacts the top surface 41' in the vertical direction. The drain 45 is located outside a second side (a right side of the gate 43 shown in FIGS. 4A and 4B) opposite to the first side of the gate 43 in a lateral direction and below the gate 43 in the vertical direction. The drain 45 is separated from the gate 43 by a drift region 44b (as indicated by a dashed regulator frame shown in FIG. 4A) in the lateral direction, and the drain 45 does not contact the gate 43. The at least one plug plate electrode 49 contacts the gate 43 and is electrically connected to the gate 43; the plug plate electrode 49 extends downward from the bottom of the gate 44 into the semiconductor substrate 41. The downward extension extends by a vertical length which is longer than the "current vertical height" of a conductive current when the high voltage device 4 is ON. The plug plate electrode 49 is located between the source 46 and the drain 45. The plug plate electrode 49 includes a dielectric layer 49a and a conductive layer 49b, wherein the dielectric layer 49a contacts the top surface 41', and the conductive layer 49b is electrically connected to the gate 43.

The high voltage well 41a has the second conductive type. The high voltage well 41a is formed in the semiconductor substrate 41, and is located beneath the top surface 41' and contacts the top surface 41' in the vertical direction. Part of the high voltage well 41a is used as a channel region 44a (as indicated by a dashed bold frame shown in FIG. 4A). The drift well 47 with the first conductive type is formed in the semiconductor substrate 41, and the drift well 47 is located beneath the top surface 41' and contacts the top surface 41'. The drain 45 is located in the drift well 47, wherein part of the drift well 47 is used as a drift region 44b (as indicated by a dashed thin frame shown in FIG. 4A). In this embodiment, the plug plate electrode 49 is entirely located in the drift well 47.

The bottom of the gate 43 is connected to and contacts plural plug plate electrodes 49. Each plug plate electrode 49 includes the dielectric layer 49a and the conductive layer 49b. Two neighboring plug plate electrodes have a spacing W therebetween in a width direction (as indicated by a dashed arrow shown in FIG. 4B). FIG. 4B shows the schematic diagram of the 3D view of the high voltage device 4, wherein the gate 43 with the plural plug plate electrodes 49 is shown to be separated from the semiconductor substrate 41 for purpose of better illustrating the feature of the present invention. As shown in FIG. 4B, the plural plug plate electrodes 49 are located between the drain 45 and the source 46 in the lateral direction. The plural plug plate electrodes 49 are arranged in parallel along the width direction. Each plug plate electrode 49 is entirely in the drift well 47, and inserts into a corresponding groove 49h in the semiconductor substrate 51.

Figure 5:
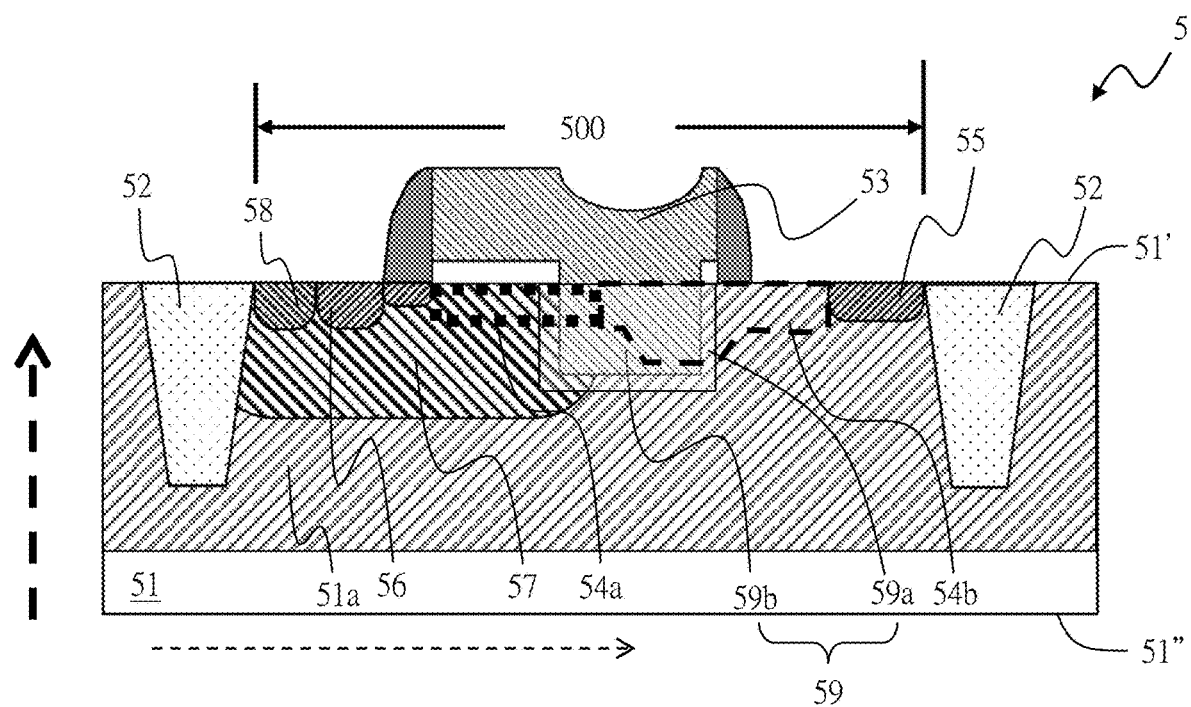
FIG. 5 shows a third embodiment of the present invention.

Please refer to FIG. 5 for a third embodiment according to the present invention. FIG. 5 shows a schematic diagram of a cross-sectional view of a high voltage device 5. Referring to FIG. 5, an isolation structure 52 is formed in a semiconductor substrate 51 to define an operation region 500. In one embodiment, the isolation structure 52 is for example but not limited to a shallow trench isolation (STI) structure as shown in FIG. 5; in another embodiment, it can be a local oxidation of silicon (LOCOS) structure. The high voltage device 5 has a top surface 51' and a bottom surface 61" opposite to the top surface 51'. The high voltage device 5 includes: a high voltage well 51a, a gate 53, a drain 55, a source 56, a body region 57, a body contact 58, and at least one plug plate electrode 59. The gate 53 is formed on the top surface 51' of the semiconductor substrate 51, and the gate 53 stacks on and contacts the top surface 51'; the gate 53 controls the high voltage device 5 to be ON or OFF according to a gate voltage applied on the gate 53. The source 56 with the first conductive type is formed in the semiconductor substrate 51. The source 56 is located beneath the top surface 51' and contacts the top surface 51' in the vertical direction. The source 56 is located adjacent to a first side (a left side of the gate 53 shown in FIG. 5) of the gate 53 in a lateral direction (as indicated by a dashed thin arrow shown in FIG. 5), and the source 56 is below the gate 53 in the vertical direction.

The drain 55 with the first conductive type is formed in the semiconductor substrate 51, and is located beneath the top surface 51' and contacts the top surface 51' in the vertical direction. The drain 55 is located outside a second side (a right side of the gate 53 shown in FIG. 5) opposite to the first side of the gate 53 in the lateral direction, and the drain 55 is below the gate 53 in the vertical direction. The drain 55 is separated from the gate 53 by a drift region 54b (as indicated by a thin dashed regulator frame shown in FIG. 5) in the lateral direction, and the drain 55 does not contact the gate 53. The at least one plug plate electrode 59 contacts the gate 53 and is electrically connected to the gate 53; the plug plate electrode 59 extends downward from the bottom of the gate 53 into the semiconductor substrate 51. The downward extension extends by a vertical length which is longer than a "current vertical height" of a conductive current when the high voltage device 5 is ON. The plug plate electrode 59 is located between the source 56 and the drain 55 in the lateral direction. The plug plate electrode 59 includes a dielectric layer 59a and a conductive layer 59b, wherein the dielectric layer 59a contacts the top surface 51', and the conductive layer 59b is electrically connected to the gate 53.

The high voltage well 51a has the first conductive type. The high voltage well 51a is formed in the semiconductor substrate 51, and is located beneath the top surface 51' and contacts the top surface 51' in the vertical direction. The source 56, the drain 55, the drift region 54b, and at least part of the plug plate electrode 59 are located in the high voltage well 51a, wherein part of the high voltage well 51a is used as the drift region 54b. The body region 57 has the second conductive type. The body region 57 is formed in the semiconductor substrate 51, and is located beneath the top surface 51' and contacts the top surface 51' in the vertical direction. The source 56 is located in the body region 57, wherein part of the body region 57 is used as a channel region 54a (as indicated by a bold dashed frame shown in FIG. 5).

As shown in FIG. 5, the plural plug plate electrodes 59 connect the bottom of the gate 53. The plug plate electrode 59 includes the dielectric layer 59a and the conductive layer 59b. Two neighboring plug plate electrodes 59 do not contact each other in a width direction and have a spacing W therebetween in the width direction. This embodiment is different from the first embodiment in that, in the first embodiment, the plug plate electrode 39 is entirely in the high voltage well 31a, while in this embodiment, a part of the plug plate electrode 59 is located in the high voltage well 51a, and another part of the plug plate electrode 59 is located in the body region 57; i.e., the plug plate electrode 59 crosses over the interface between the channel region 54a and the drift region 54b.

Figure 6:
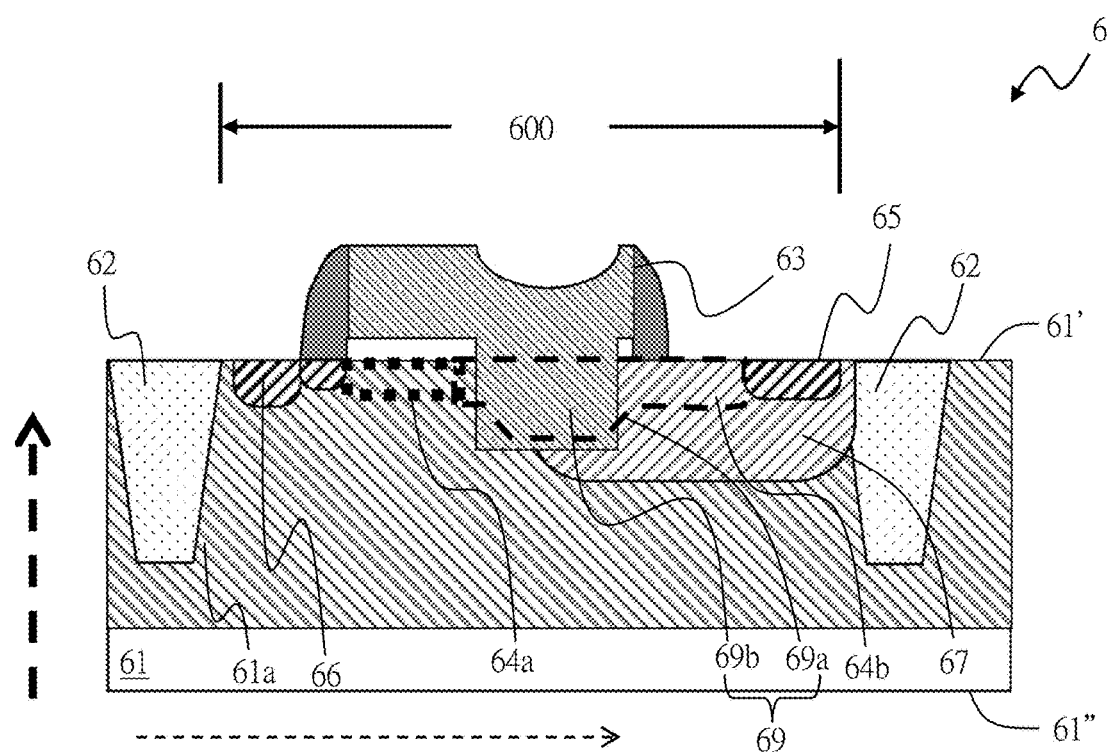
FIG. 6 shows a fourth embodiment of the present invention.

Please refer to FIG. 6 for a fourth embodiment according to the present invention. FIG. 6 shows a schematic diagram of a cross-sectional view of a high voltage device 6. Referring to FIG. 6, an isolation structure 62 is formed in a semiconductor substrate 61 to define an operation region 600. In one embodiment, the isolation structure 62 is for example but not limited to a shallow trench isolation (STI) structure as shown in FIG. 6, and in another embodiment, it can be a local oxidation of silicon (LOCOS) structure. The high voltage device 6 has a top surface 61' and a bottom surface 61" opposite to the top surface 61'. The high voltage device 6 includes: a high voltage well 61a, a gate 63, a drain 65, a source 66, a drift well 67, and at least one plug plate electrode 69. The gate 63 is formed on the top surface 61' of the semiconductor substrate 61, and the gate 63 stacks on and contacts the top surface 61'; the gate 63 controls the high voltage device 6 to be ON or OFF according to a gate voltage applied on the gate 63. The source 66 with the first conductive type is formed in the semiconductor substrate 61. The source 66 is located beneath the top surface 61' and contacts the top surface 51' in the vertical direction. The source 66 is located adjacent to a first side (a left side of the gate 63 shown in FIG. 6) of the gate 63 in a lateral direction, and the source 66 is below the gate 63 in the vertical direction.

The drain 65 with the first conductive type is formed in the semiconductor substrate 61, and is located beneath the top surface 61' and contacts the top surface 61' in the vertical direction. The drain 65 is located outside a second side (a right side of the gate 63 shown in FIG. 6) opposite to the first side of the gate 63 in the lateral direction, and the drain 65 is below the gate 63 in the vertical direction. The drain 65 is separated from the gate 63 by the drift region 64b in the lateral direction, and the drain 65 does not contact the gate 63. The at least one plug plate electrode 69 contacts the gate 63 and is electrically connected to the gate 63; the plug plate electrode 69 extends downward from the bottom of the gate 63 into the semiconductor substrate 61. The downward extension extends by a vertical length which is longer than a "current vertical height" of a conductive current when the high voltage device 6 is ON. The plug plate electrode 69 is located between the source 66 and the drain 65 in the lateral direction. The plug plate electrode 69 includes a dielectric layer 69a and a conductive layer 69b, wherein the dielectric layer 69a contacts the top surface 61', and the conductive layer 69b is electrically connected to the gate 63.

The high voltage well 61a has the second conductive type. The high voltage well 61a is formed in the semiconductor substrate 61, and is located beneath the top surface 61' and contacts the top surface 61' in the vertical direction. Part of the high voltage well 61a is used as a channel region 64a (as indicated by a dashed bold frame shown in FIG. 6). The drift well 67 with the first conductive type is formed in the semiconductor substrate 61, and the drift well 67 is located beneath the top surface 61' and contacts the top surface 61'. The drain 65 is located in the drift well 67, wherein part of the drift well 67 is used as a drift region 64b (as indicated by a dashed thin frame shown in FIG. 6).

The bottom of the gate 63 is connected to and contacts plural plug plate electrodes 69. Each plug plate electrode 69 includes the dielectric layer 69a and the conductive layer 69b. Two neighboring plug plate electrodes have a spacing W therebetween in a width direction (as indicated by a dashed arrow shown in FIG. 6). This embodiment is different from the second embodiment in that, in the second embodiment, the plug plate electrode 49 is entirely in the drift well 47, while in this embodiment, a part of the plug plate electrode 69 is located in the drift well 67, and another part of the plug plate electrode 69 is located in the high voltage well 61a; i.e., the plug plate electrode 69 crosses over the interface between the channel region 64a and the drift region 64b.

Figure 7A:
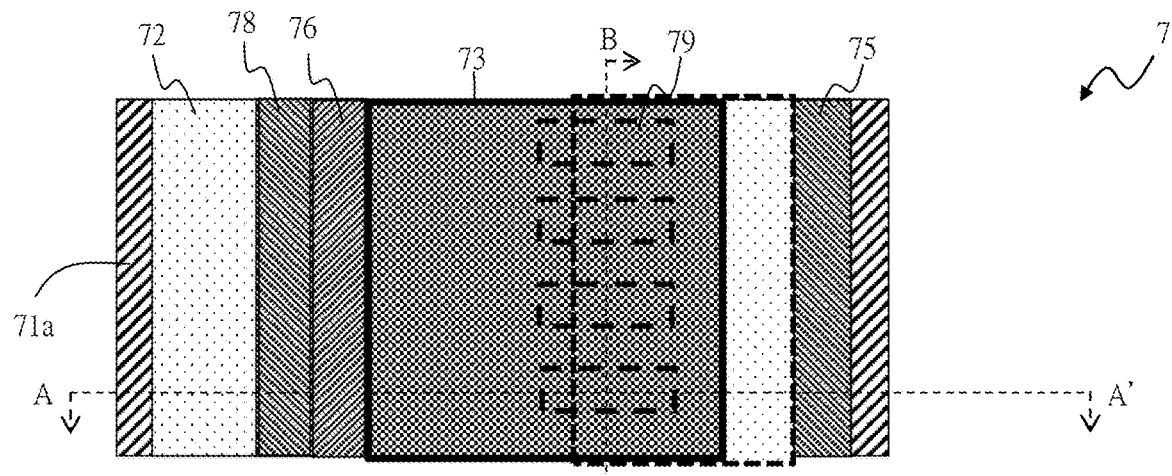
FIGS. 7A-7C show a fifth embodiment of the present invention.
Figure 7B:
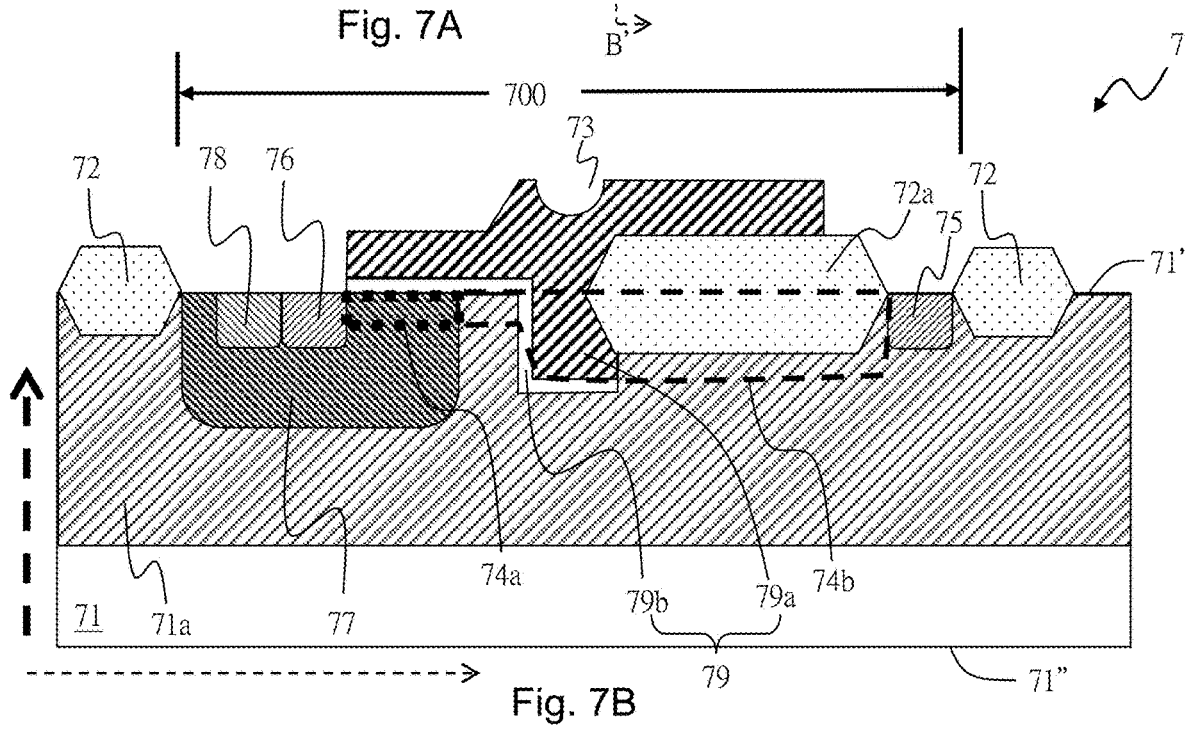
Figure 7C:
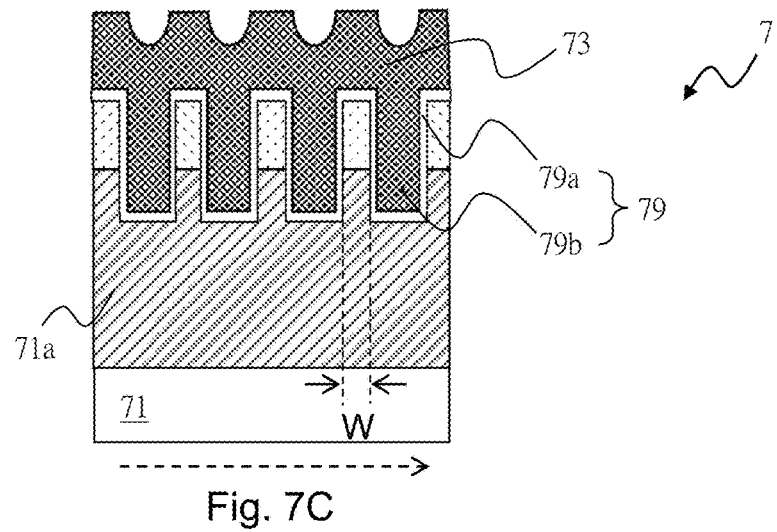

Please refer to FIGS. 7A-7C for a fifth embodiment according to the present invention. FIG. 7A shows a schematic diagram of a top view of a high voltage device 7. FIG. 7B shows a schematic diagram of a cross-sectional view along a cross-section line AA' shown in FIG. 7A, and FIG. 7C shows a schematic diagram of a cross-sectional view along a cross-section line BB' shown in FIG. 7A. First, a semiconductor substrate 71 is provided, which is for example but not limited to a P-type silicon substrate. Referring to FIGS. 7A and 7B, an isolation structure 72 is formed in the semiconductor substrate 71 to define an operation region 700. In one embodiment, the isolation structure 72 is for example but not limited to the local oxidation of silicon (LOCOS) structure as shown in FIG. 7B, and in another embodiment, it can be the shallow trench isolation (STI) structure. Next, a high voltage well 71a, a gate 73, a drain 75, a source 76, a body region 77, a body contact 78, and at least one plug plate electrode 79 are formed in the semiconductor substrate 71. The high voltage well 71a, the drain 75, and the source 76 have the first conductive type, and the body region 77 and the body contact 78 have the second conductive type. The first conductive type and the second conductive type are opposite to each other; i.e., when the first conductive type is N-type, the second conductive type is P-type, and when the first conductive type is P-type, the second conductive type is N-type.

The high voltage well 71a may be the semiconductor substrate 71 itself, or formed by anion implantation process which implants the first conductive type impurities to a defined region. The drain 75 and the source 76 are formed by a lithography process (including a self-alignment process) and an ion implantation process, wherein the lithography process defines the implantation regions by a photoresist mask together with a self-alignment effect provided by all or a part of the gate 73 and the isolation structure 72, and the ion implantation process implants the first conductive type impurities to the implantation regions. The drain 75 and the source 76 are at different sides of and below the gate 73. The body region 77 and the body contact 78 are formed by a lithography process (including a self-alignment process) and an ion implantation process, wherein the lithography process defines the implantation regions by a photoresist mask together with a self-alignment effect provided by all or a part of the gate 73 and the isolation structure 72, and the ion implantation process implants the second conductive type impurities to the implantation regions. The high voltage device 7 has a drift region 74b (as indicated by a thin dashed frame shown in FIG. 7B) between the drain 75 and the gate 73, which separates the drain 75 and the gate 73. The drift region 74b has a length in a lateral direction (as indicated by a dashed arrow shown in FIG. 7B), wherein the length may be adjusted according to the operation voltage designed for normal operation.

The high voltage device 7 has a top surface 71' and a bottom surface 71" opposite to the top surface 71' in a vertical direction (as indicated by a bold dashed arrow shown in FIG. 7B). The high voltage device 7 includes: a high voltage well 71a, a gate 73, a source 76, a drain 75, a body region 77, a body contact 78, a field oxide region 72a, and at least one plug plate electrode 79. The gate 73 is formed on the top surface 71' of the semiconductor substrate 71, and the gate 73 stacks on and contacts the top surface 71'; the gate 73 controls the high voltage device 7 to be ON or OFF according to a gate voltage applied on the gate 73. The source 76 with the first conductive type is formed in the semiconductor substrate 71. The source 76 is located beneath the top surface 71' and contacts the top surface 71' in the vertical direction. The source 76 is located adjacent to a first side (a left side of the gate 73 shown in FIGS. 7A and 7B) of the gate 73 in a lateral direction, and the source 76 is below the gate 73 in the vertical direction. The field oxide region 72a stacks on and contacts the top surface 71' in the vertical direction. At least part of the gate 73 near the drain 75 (relatively to the source 76) stacks right above and contacts the field oxide region 72a. The plug plate electrode 79 dos not penetrate through the field oxide region 72a.

The drain 75 with the first conductive type is formed in the semiconductor substrate 71, and is located beneath the top surface 71' and contacts the top surface 71' in the vertical direction. The drain 75 is located outside a second side (a right side of the gate 73 shown in FIGS. 7A and 7B) opposite to the first side of the gate 73 in the lateral direction, and the drain 75 is below the gate 73 in the vertical direction. The drain 75 is separated from the gate 73 by the drift region 74b in the lateral direction, and the drain 75 does not contact the gate 73. The at least one plug plate electrode 79 contacts the gate 73 and is electrically connected to the gate 73; the plug plate electrode 79 extends downward from the bottom of the gate 73 into the semiconductor substrate 71. The downward extension extends by a vertical length which is longer than a "current vertical height" of a conductive current when the high voltage device 7 is ON. The plug plate electrode 79 is located between the source 76 and the drain 75 in the lateral direction. The plug plate electrode 79 includes a dielectric layer 79a and a conductive layer 79b, wherein the dielectric layer 79a contacts the top surface 71', and the conductive layer 79b is electrically connected to the gate 73.

The high voltage well 71a has the first conductive type. The high voltage well 71a is formed in the semiconductor substrate 71, and is located beneath the top surface 71' and contacts the top surface 71' in the vertical direction. The source 76, the drain 75, the drift region 74b, and at least part of the plug plate electrode 79 are located in the high voltage well 71a, wherein part of the high voltage well 71a is used as the drift region 74b. The body region 77 has the second conductive type. The body region 77 is formed in the semiconductor substrate 71, and is located beneath the top surface 71' and contacts the top surface 71' in the vertical direction. The source 76 is located in the body region 77, wherein part of the body region 77 is used as a channel region 74a (as indicated by a bold dashed frame shown in FIG. 7B).

When a gate voltage is applied on the gate 73 to turn ON the high voltage device 7, the channel region 74a is reversed to conduct current between the drain 75 and the source 76, and the drift region 74b is a region between the channel region 74a and the drain 75 where the conductive current flows through, as well known by those skilled in the art, so details thereof are omitted here. The "conductive current" in the context of this invention indicates a major current flowing between the drain 75 and the source 76 when the high voltage device 7 turns ON. The current vertical height of the conductive current extends from the top surface 71' downward. The plug plate electrode 79 has a same voltage level as the gate 73 because the plug plate electrode 79 is electrically connected to the gate 73, and extends downward from the bottom of the gate 73 into the semiconductor substrate 71 by a length longer than the current vertical height. Thus, when the high voltage device 7 is ON, more carriers can be induced in the drift region 74b to increase the conductive current, and the conductive resistance is reduced.

That is, according to the present invention, when the high voltage device 7 turns ON, the plug plate electrode 79 can induce more carriers because of its voltage level, and thus the conductive current is higher than the prior art. From another perspective, it can be regarded as that the boundary of the drift region 74*b* extends lower to the interface between the high voltage well 71*a* and the plug plate electrode 79. The plug plate electrode 79 is not located right below the field oxide region 72*a*.

A bottom surface of the dielectric layer 79*a* contacts the semiconductor substrate 71 as shown in FIGS. 7B and 7C, and the conductive layer 79*b* is filled in a groove formed by a hallow space inside the dielectric layer 79*a*. FIG. 7C shows the schematic diagram of the cross-sectional view along a cross-section line BB' shown in FIG. 7A. As shown in the figure, the plural plug plate electrodes 79 contact the bottom of the gate 73. Each plug plate electrode 79 includes the dielectric layer 79*a* and the conductive layer 79*b*. Two neighboring plug plate electrodes do not contact each other in a width direction (as indicated by a dashed arrow shown in FIG. 7C) and have a spacing W therebetween in the width direction. FIG. 7C shows that plural plug plate electrodes are arranged in parallel in the width direction.

Figure 8:
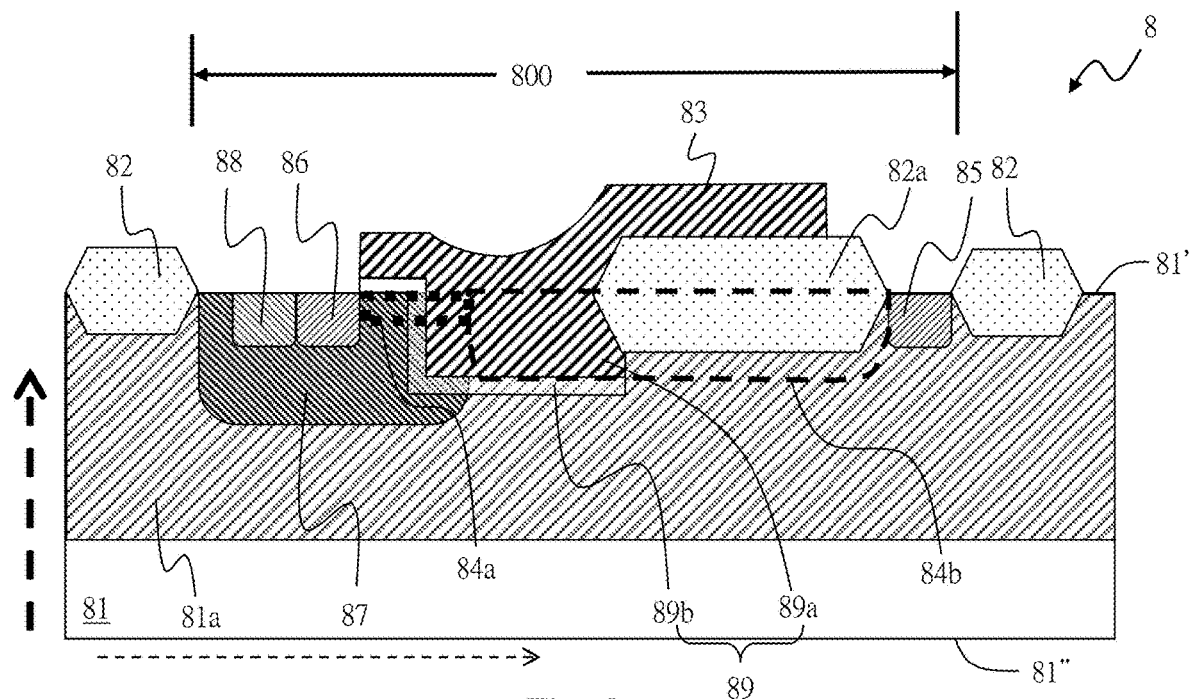
FIG. 8 shows a sixth embodiment of the present invention.

Please refer to FIG. 8 for a sixth embodiment according to the present invention. FIG. 8 shows a schematic diagram of a cross-sectional view of a high voltage device 8. Referring to FIG. 8, an isolation structure 82 is formed in a semiconductor substrate 81 to define an operation region 800. In one embodiment, the isolation structure 82 is for example but not limited to the local oxidation of silicon (LOCOS) structure as shown in FIG. 5, and in another embodiment, it can be the shallow trench isolation (STI) structure. The high voltage device 8 has a top surface 81' and a bottom surface 81" opposite to the top surface 81'. The high voltage device 8 includes: a high voltage well 81*a*, a gate 83, a drain 85, a source 86, a body region 87, a body contact 88, a field oxide region 82*a*, and at least one plug plate electrode 89. The gate 83 is formed on the top surface 81' of the semiconductor substrate 81, and the gate 83 stacks on and contacts the top surface 81'; the gate 83 controls the high voltage device 8 to be ON or OFF according to a gate voltage applied on the gate 83. The source 86 with the first conductive type is formed in the semiconductor substrate 81. The source 86 is located beneath the top surface 81' and contacts the top surface 81' in the vertical direction. The source 86 is located adjacent to a first side (a left side of the gate 83 shown in FIG. 8) of the gate 83 in a lateral direction (as indicated by a dashed thin arrow shown in FIG. 8), and the source 86 is below the gate 83 in the vertical direction. The field oxide region 82*a* stacks on and contacts the top surface 81' in the vertical direction. At least part of the gate 83 near the drain 85 (relatively to the source 86) stacks right above and contacts the field oxide region 82*a*. The plug plate electrode 89 does not penetrate through the field oxide region 82*a*.

The drain 85 with the first conductive type is formed in the semiconductor substrate 81, and is located beneath the top surface 81' and contacts the top surface 81' in the vertical direction. The drain 85 is located outside a second side (a right side of the gate 83 shown in FIG. 8) opposite to the first side of the gate 83 in the lateral direction, and the drain 85 is below the gate 83 in the vertical direction. The drain 85 is separated from the gate 83 by a drift region 84*b* (as indicated by a thin dashed regulator frame shown in FIG. 8) in the lateral direction, and the drain 85 does not contact the gate 83. The at least one plug plate electrode 89 contacts the gate 83 and is electrically connected to the gate 83; the plug plate electrode 89 extends downward from the bottom of the gate 83 into the semiconductor substrate 81. The downward extension extends by a vertical length which is longer than a "current vertical height" of a conductive current when the high voltage device 8 is ON. The plug plate electrode 89 is located between the source 86 and the drain 85 in the lateral direction. The plug plate electrode 89 includes a dielectric layer 89*a* and a conductive layer 89*b*, wherein the dielectric layer 89*a* contacts the top surface 81', and the conductive layer 89*b* is electrically connected to the gate 83.

The high voltage well 81*a* has the first conductive type. The high voltage well 81*a* is formed in the semiconductor substrate 81, and is located beneath the top surface 81' and contacts the top surface 81' in the vertical direction. The source 86, the drain 85, and the drift region 84*b* are located in the high voltage well 81*a*, wherein part of the high voltage well 81*a* is used as the drift region 84*b*. The body region 87 has the second conductive type. The body region 87 is formed in the semiconductor substrate 81, and is located beneath the top surface 81' and contacts the top surface 81' in the vertical direction. The source 86 is located in the body region 87, wherein part of the body region 87 is used as a channel region 84*a* (as indicated by a bold dashed frame shown in FIG. 8).

As shown in FIG. 8, the plural plug plate electrodes 89 contact the bottom of the gate 83. Each plug plate electrode 89 includes the dielectric layer 89*a* and the conductive layer 89*b*. Two neighboring plug plate electrodes 89 do not contact each other in a width direction and have a spacing W therebetween in the width direction. This embodiment is different from the fifth embodiment in that, in the fifth embodiment, the plug plate electrode 79 is entirely in the high voltage well 71*a*, while in this embodiment, a part of the plug plate electrode 89 is located in the high voltage well 81*a*, and another part of the plug plate electrode 89 is located in the body region 87; i.e., the plug plate electrode 89 crosses over the interface between the channel region 84*a* and the drift region 84*b*. The plug plate electrode 89 does not penetrate through the field oxide region 82*a*.

Figure 9:
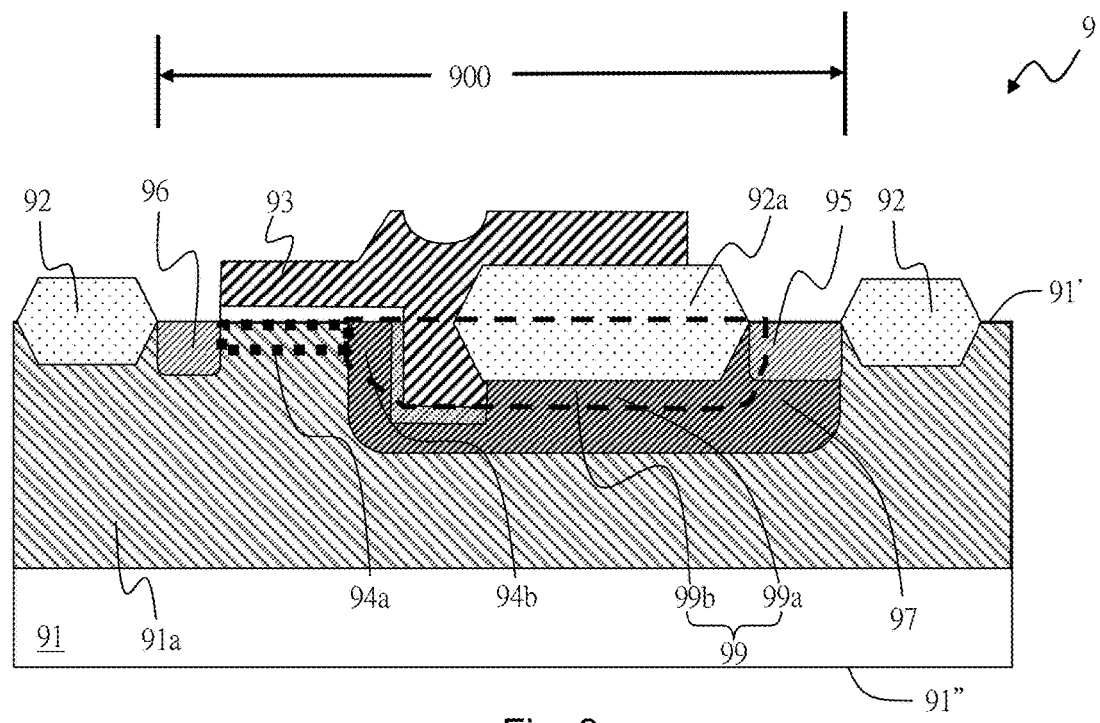
FIG. 9 shows a seventh embodiment of the present invention.

Please refer to FIG. 9 for a seventh embodiment according to the present invention. FIG. 9 shows a schematic diagram of a cross-sectional view of a high voltage device 9. Referring to FIG. 9, an isolation structure 92 is formed in a semiconductor substrate 91 to define an operation region 900. In one embodiment, the isolation structure 92 is for example but not limited to the local oxidation of silicon (LOCOS) structure as shown in FIG. 9, and in another embodiment, it can be the shallow trench isolation (STI) structure. The high voltage device 9 has a top surface 91' and a bottom surface 91" opposite to the top surface 91'. The high voltage device 9 includes: a high voltage well 91*a*, a gate 93, a drain 95, a source 96, a drift well 97, a field oxide region 92*a*, and at least one plug plate electrode 99. The gate 93 is formed on the top surface 91' of the semiconductor substrate 91, and the gate 93 stacks on and contacts the top surface 91' in the vertical direction; the gate 93 controls the high voltage device 9 to be ON or OFF according to a gate voltage applied on the gate 93. The source 96 with the first conductive type is formed in the semiconductor substrate 91. The source 96 is located beneath the top surface 91' and contacts the top surface 91' in the vertical direction. The source 96 is located adjacent to a first side (a left side of the gate 93 shown in FIG. 9) of the gate 93 in a lateral direction (as indicated by a dashed thin arrow shown in FIG. 9), and the source 96 is below the gate 93 in the vertical direction. The field oxide region 92*a* stacks on and contacts the top surface 91' in the vertical direction. At least part of the gate 93 near the drain 95 (relatively to the source 96) stacks right above and contacts the field oxide region 92a. The plug plate electrode 99 does not penetrate through the field oxide region 92a.

The drain 95 with the first conductive type is formed in the semiconductor substrate 91, and is located beneath the top surface 91' and contacts the top surface 91' in the vertical direction. The drain 95 is located outside a second side (a right side of the gate 93 shown in FIG. 9) opposite to the first side of the gate 93 in the lateral direction, and the drain 95 is below the gate 93 in the vertical direction. The drain 95 is separated from the gate 93 by the drift region 94b in the lateral direction, and the drain 95 does not contact the gate 93. The at least one plug plate electrode 99 contacts the gate 93 and is electrically connected to the gate 93; the plug plate electrode 99 extends downward from the bottom of the gate 93 into the semiconductor substrate 91. The downward extension extends by a vertical length which is longer than a "current vertical height" of a conductive current when the high voltage device 9 is ON. The plug plate electrode 99 is located between the source 96 and the drain 95 in the lateral direction. The plug plate electrode 99 includes a dielectric layer 99a and a conductive layer 99b, wherein the dielectric layer 99a contacts the top surface 91', and the conductive layer 99b is electrically connected to the gate 93.

The high voltage well 91a has the second conductive type. The high voltage well 91a is formed in the semiconductor substrate 91, and is located beneath the top surface 91' and contacts the top surface 91' in the vertical direction. Part of the high voltage well 91a is used as a channel region 94a (as indicated by a dashed bold frame shown in FIG. 9). The drift well 97 with the first conductive type is formed in the semiconductor substrate 91, and the drift well 97 is located beneath the top surface 91' and contacts the top surface 91'. The drain 95 is located in the drift well 97, wherein part of the drift well 97 is used as a drift region 94b (as indicated by a thin dashed frame shown in FIG. 9).

The bottom of the gate 93 is connected to and contacts plural plug plate electrodes 99. Each plug plate electrode 99 includes the dielectric layer 99a and the conductive layer 99b. Two neighboring plug plate electrodes have a spacing W therebetween in the width direction. The plug plate electrode 99 is located between the drain 95 and the source 96. The plural plug plate electrodes 99 are arranged in parallel in the width direction. The plural plug plate electrodes 99 are entirely in the drift well 97, and the plural plug plate electrodes 99 are inserted to corresponding grooves in the semiconductor substrate 91 respectively (referring to the grooves 49h shown in FIG. 4B).

Figure 10:
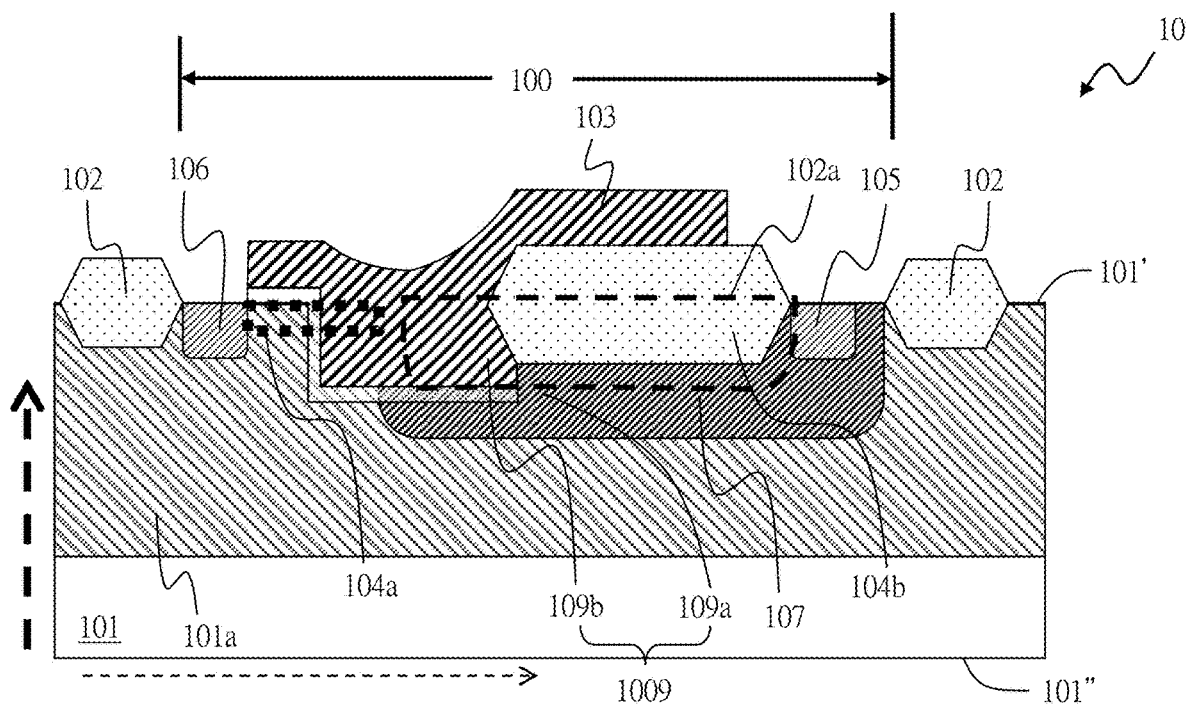
FIG. 10 shows an eighth embodiment of the present invention.

Please refer to FIG. 10 for an eighth embodiment according to the present invention. FIG. 10 shows a schematic diagram of a cross-sectional view of a high voltage device 10. Referring to FIG. 10, an isolation structure 102 is formed in a semiconductor substrate 101 to define an operation region 100. In one embodiment, the isolation structure 102 is for example but not limited to the local oxidation of silicon (LOCOS) structure as shown in FIG. 10, and in another embodiment, it can be the shallow trench isolation (STI) structure. The high voltage device 10 has a top surface 101' and a bottom surface 101" opposite to the top surface 101'. The high voltage device 10 includes: a high voltage well 101a, a gate 103, a drain 105, a source 106, a drift well 107, a field oxide region 102a, and at least one plug plate electrode 109. The gate 103 is formed on the top surface 101' of the semiconductor substrate 101, and the gate 103 stacks on and contacts the top surface 101' in the vertical direction; the gate 103 controls the high voltage device 10 to be ON or OFF according to a gate voltage applied on the gate 103. The source 106 with the first conductive type is formed in the semiconductor substrate 101. The source 106 is located beneath the top surface 101' and contacts the top surface 101' in the vertical direction. The source 106 is located adjacent to a first side (a left side of the gate 103 shown in FIG. 10) of the gate 103 in a lateral direction (as indicated by a dashed thin arrow shown in FIG. 10), and the source 106 is below the gate 103 in the vertical direction. The field oxide region 102a stacks on and contacts the top surface 101' in the vertical direction. At least part of the gate 103 near the drain 105 (relatively to the source 106) stacks right above and contacts the field oxide region 102a in the vertical direction. Part of the gate 103 overlays the field oxide region 92a, and the plug plate electrode 109 does not penetrate through the field oxide region 102a.

The drain 105 with the first conductive type is formed in the semiconductor substrate 101, and is located beneath the top surface 101' and contacts the top surface 101' in the vertical direction. The drain 105 is located outside a second side (a right side of the gate 103 shown in FIG. 10) opposite to the first side of the gate 103 in the lateral direction, and the drain 105 is below the gate 103 in the vertical direction. The drain 105 is separated from the gate 103 by the drift region 104b (as indicated by a dashed frame shown in FIG. 10) in the lateral direction, and the drain 105 does not contact the gate 103. The at least one plug plate electrode 109 contacts the gate 103 and is electrically connected to the gate 103; the plug plate electrode 109 extends downward from the bottom of the gate 103 into the semiconductor substrate 101. The downward extension extends by a vertical length which is longer than a "current vertical height" of a conductive current when the high voltage device 10 is ON. The plug plate electrode 109 is located between the source 106 and the drain 105 in the lateral direction. The plug plate electrode 109 includes a dielectric layer 109a and a conductive layer 109b, wherein the dielectric layer 109a contacts the top surface 101', and the conductive layer 109b is electrically connected to the gate 103.

The high voltage well 101a has the second conductive type. The high voltage well 101a is formed in the semiconductor substrate 101, and is located beneath the top surface 101' and contacts the top surface 101' in the vertical direction. Part of the high voltage well 101a is used as a channel region 104a (as indicated by a dashed bold frame shown in FIG. 10). The drift well 107 with the first conductive type is formed in the semiconductor substrate 101, and the drift well 107 is located beneath the top surface 101' and contacts the top surface 101'. The drain 105 is located in the drift well 107, wherein part of the drift well 107 is used as a drift region 104b (as indicated by a thin dashed frame shown in FIG. 10).

As shown in FIG. 10, the plural plug plate electrodes 109 contact the bottom of the gate 103. Each plug plate electrode 109 includes the dielectric layer 109a and the conductive layer 109b. Two neighboring plug plate electrodes 109 do not contact each other in a width direction and have a spacing W therebetween in the width direction. The plug plate electrode 109 is located between the drain 105 and the source 106. The plural plug plate electrodes 109 are arranged in parallel in the width direction. The plural plug plate electrodes 109 are inserted to corresponding grooves in the semiconductor substrate 101 respectively (referring to the grooves 49h shown in FIG. 4B). This embodiment is different from the seventh embodiment in that, in the seventh embodiment, the plug plate electrode 99 is entirely in the drift well 97, while in this embodiment, a part of the plug plate electrode 109 is located in the drift well 107, and another part of the plug plate electrode 109 is located in the high voltage well 101*a*; i.e., the plug plate electrode 109 crosses over the interface between the channel region 104*a* and the drift region 104*b*.

Figure 11:
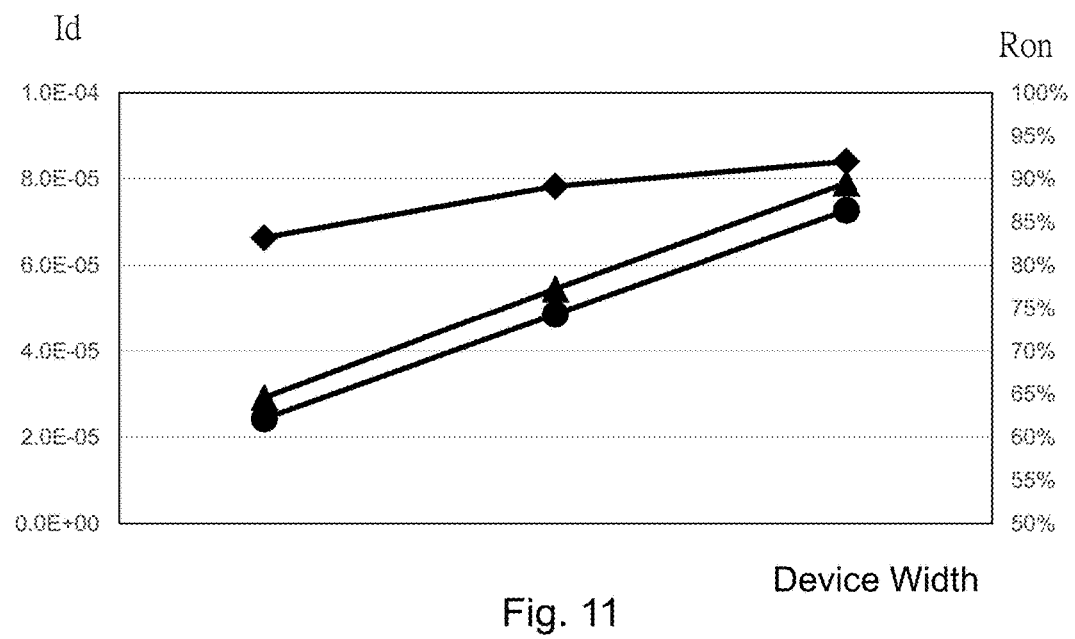
FIG. 11 shows a schematic diagram of characteristics of conductive current and conductive resistance versus width between plug plate electrodes of high voltage devices of the prior art and the present invention.

FIG. 11 shows a comparison between characteristic curves of conductive current Id and conductive resistance Ron of the present invention and the prior art. The horizontal axis is the device width; in the prior art, there is no plug plate electrode, so the device width is the width of the gate; in the present invention, the device width is the sum of the widths of two neighboring plug plate electrodes plus a spacing therebetween. As shown in the figure, solid circle dots indicate the prior art conductive current Id, and solid triangle dots indicate the conductive current Id of the present invention. As shown in the figure, the high voltage device of the present invention has relatively higher conductive currents Id in various different device widths compared to the prior art. The conductive current Id is higher when the device width increases. Solid rhombic dots indicate a ratio of the conductive resistance Ron of the present invention to the prior art with the same device width, i.e., the ratio of the conductive resistance Ron of the present invention with a device width to the conductive resistance Ron of the prior art with the same device width. As shown in the figure, the high voltage device according to the present invention has a relatively lower conductive resistance Ron (because the ratio to the prior art is lower than 1), and thus an operation speed of the high voltage device is relatively higher, and the application range of the high voltage device according to the present invention is broader.

FIG. 12 shows a comparison between characteristic curves of conductive current Id and conductive resistance Ron (versus impurity concentration of a drift region) of the present invention and the prior art. As shown in the figure, solid circle dots indicate the prior art conductive current Id, and solid triangle dots indicate the conductive current Id of the present invention. As shown in the figure, the high voltage device of the present invention has relatively higher conductive currents Id in various different impurity concentrations of the drift region compared to the prior art. Solid rhombic dots indicate a ratio of the conductive resistance Ron of the present invention to the prior art with the same impurity concentration of the drift region, i.e., the ratio of the conductive resistance Ron of the present invention with an impurity concentration of the drift region to the conductive resistance Ron of the prior art with the same impurity concentration of the drift region. As shown in the figure, the high voltage device according to the present invention has a relatively lower conductive resistance Ron (because the ratio to the prior art is lower than 1), and thus an operation speed of the high voltage device is relatively higher, and the application range of the high voltage device according to the present invention is broader.

FIG. 13 shows a comparison between characteristic curves of conductive current Id and conductive resistance Ron (versus the length L with and without the plug plate electrode) of the present invention and the prior art. The horizontal axis is the length L; in the prior art, there is no plug plate electrode, so the length L is the channel length; in the present invention, the length L is the length of the plug plate electrode. As shown in the figure, solid circle dots indicate the prior art conductive current Id, and solid triangle dots indicate the conductive current Id of the present invention. As shown in the figure, the high voltage device of the present invention has relatively higher conductive currents Id in various different lengths L with the plug plate electrode compared to the prior art without the plug plate electrode. As shown in the figure, the conductive current Id of the present invention is higher than the prior art conductive current Id; and the improvement of the conductive current Id is more significant as the length L is longer. Solid rhombic dots indicate a ratio of the conductive resistance Ron of the present invention and the prior art with the same length L with and without the plug plate electrode respectively, i.e., the ratio of the conductive resistance Ron of the present invention with the plug plate electrode having a length L to the conductive resistance Ron of the prior art without the plug plate electrode and having a channel length L. As shown in the figure, the high voltage device according to the present invention has a relatively lower conductive resistance Ron (because the ratio to the prior art is lower than 1), and thus an operation speed of the high voltage device is relatively higher, and the application range of the high voltage device according to the present invention is broader.

Figure 14A:
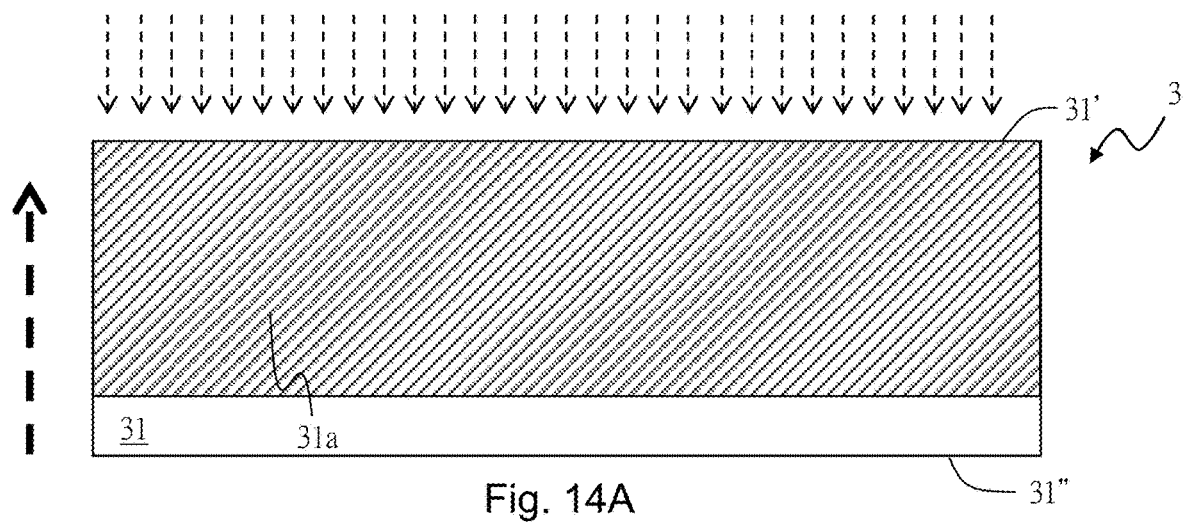
FIGS. 14A-14E show a ninth embodiment of the present invention.

FIGS. 14A-14E show a ninth embodiment of the present invention. This embodiment for example shows schematic diagrams from the cross-section view of a manufacturing method of the high voltage device 3 according to the present invention. As shown in FIG. 14A, the semiconductor substrate 31 is provided, wherein the semiconductor substrate 31 is for example but not limited to a P-type silicon substrate (or another type of semiconductor substrate in another embodiment). The semiconductor substrate 31 includes a top surface 31' and a bottom surface 31" opposite to the top surface 31' in the vertical direction (as shown by the bold dash arrow in FIG. 14A). Next, as shown in FIG. 14A, the high voltage well 31*a* is formed in the semiconductor substrate 31, wherein the high voltage well 31*a* is located beneath the top surface 31' and contacts the top surface 31*a*' in the vertical direction. The high voltage well 31*a* may be formed by for example but not limited to a method of a lithography process, an ion implantation process (as indicated by thin dashed arrows shown in the figure), and a thermal process as well known by those skilled in the art, so details thereof are omitted here. The source 36, the drain 35, the drift region 34*b*, and at least part of the plug plate electrode 39 formed in later steps are located in the high voltage well 31*a*, wherein part of the high voltage well 31*a* is used as the drift region 34*b*.

Figure 14B:
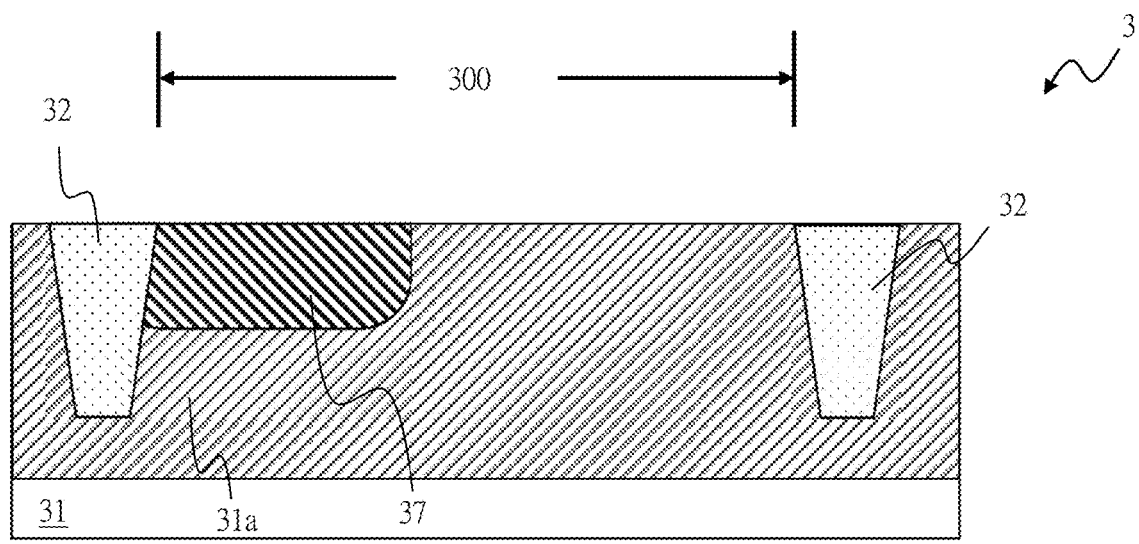

Next, as shown in FIG. 14B, the isolation structure 32 is formed in the semiconductor substrate 31 to define an operation region 300. In one embodiment, the isolation structure 32 is for example but not limited to a shallow trench isolation (STI) structure as shown in FIG. 3B, and in another embodiment, it can be a local oxidation of silicon (LOCOS) structure. Next, the body region 37 is formed in the semiconductor substrate 31. The body region 37 has the second conductive type. The body region 37 is located beneath the top surface 31' and contacts the top surface 31' in the vertical direction. The source 36 formed in a later process is located in the body region 37, wherein part of the body region 37 is used as the channel region 34*a*.

Figure 14C:
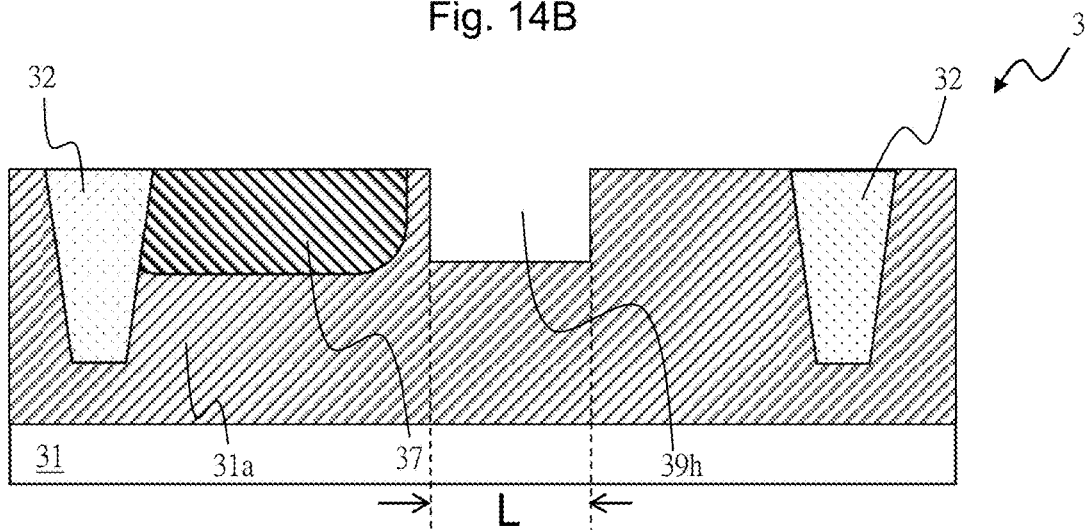
Figure 14D:
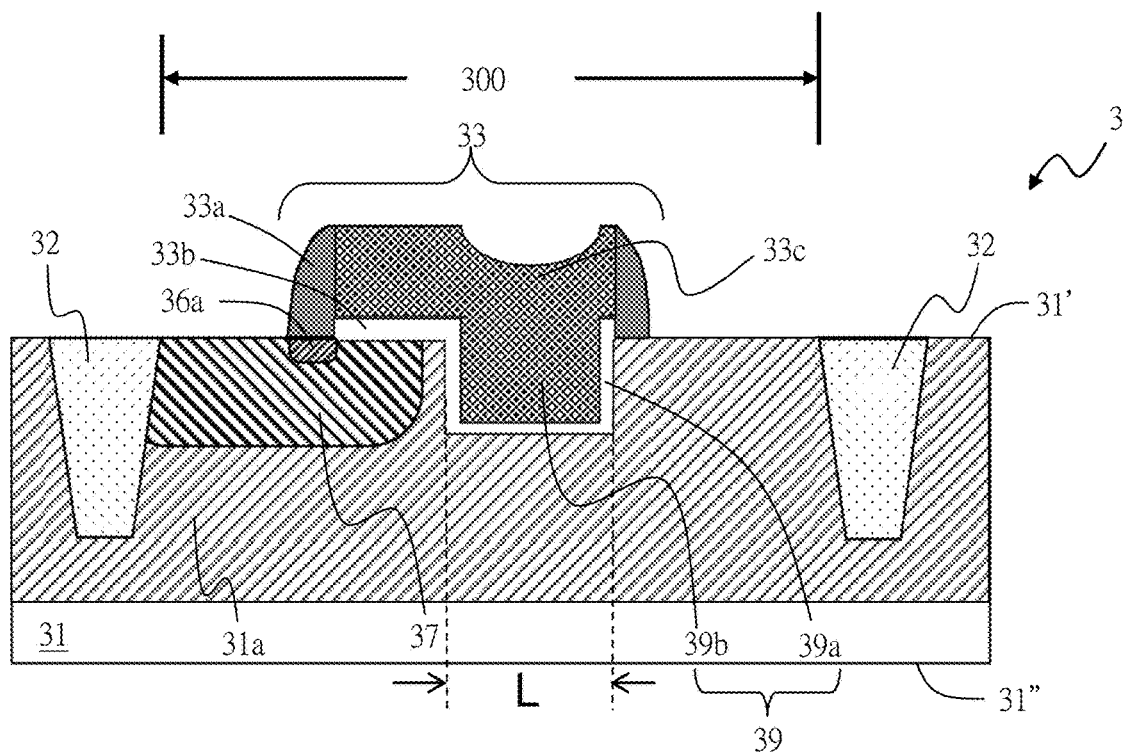

Next, as shown in FIG. 14C, the grooves 39*h* are formed in the semiconductor substrate 31. The grooves 39*h* may be formed by a lithography process and an etching process. The groove 39*h* has the length L in the lateral direction. Next, as shown in FIG. 14D, the gate 33 is formed on the top surface 31' of the semiconductor substrate 31, and the gate 33 stacks on and contacts the top surface 31'; the gate 33 controls the high voltage device 3 to be ON or OFF according to a gate voltage applied on the gate 33. The lightly doped region 36*a* with the first conductive type is formed beneath the top surface 31' and contacts the top surface 31'. The lightly doped region 36a is located right below a spacer layer 36a of the gate 33. In this embodiment, the plug plate electrode 39 and the gate 33 may be formed at the same time with same process steps. That is, the dielectric layer 39a and the conductive layer 39b of the plug plate electrode 39, may be the same materials as the dielectric layer 33b and conductive layer 33c of the gate 33 respectively, and for example formed by same process steps of the dielectric layer 33b and conductive layer 33c of the gate 33. The dielectric layer 39a contacts the top surface 31', and the conductive layer 39b is electrically connected to the gate 33. In this embodiment, the conductive layer 39b and the conductive layer 33c are formed by the same process with the same material, and are electrically connected to each other. The at least one plug plate electrode 39 contacts the bottom of the gate 33 and is electrically connected to the gate 33; the plug plate electrode 39 extends downward from the bottom of the gate 33 into the semiconductor substrate 31. The downward extension extends by a vertical length which is longer than a "current vertical height" of a conductive current when the high voltage device 3 is ON. the plug plate electrode 39 is located between the source 36 and the drain 35 formed in later process in the lateral direction.

Figure 14E:
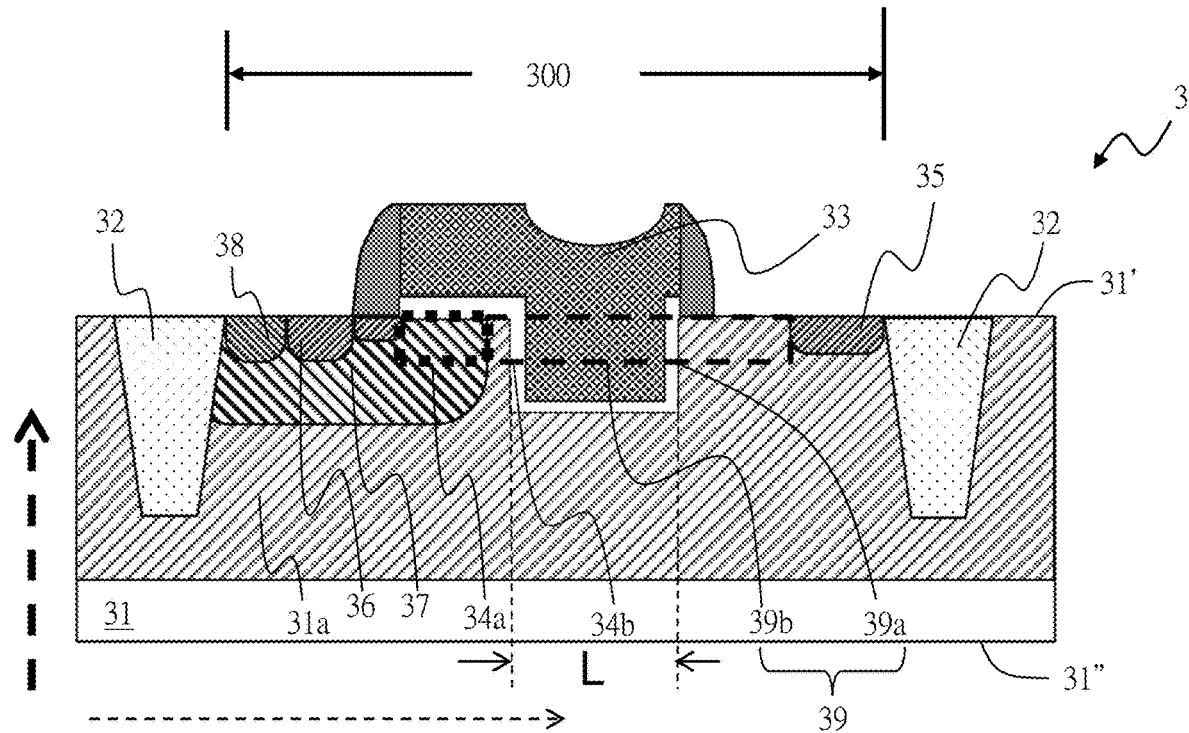

Next, as shown in FIG. 14E, the drain 35 and the source 36 are formed by the lithography process (including the self-alignment process) and the ion implantation process, wherein the lithography process defines the implantation regions by the photoresist mask together with the self-alignment effect provided by all or part of the gate 33 and the isolation structure 32, and the ion implantation process implants the first conductive type impurities to the implantation regions. The drain 35 and the source 36 are at different sides of and below the gate 33. Next, the body region 37 is formed by the lithography process (including the self-alignment process) and the ion implantation process, wherein the lithography process defines the implantation regions by a photoresist mask together with the self-alignment effect provided by all or a part of the gate 33 and the isolation structure 32, and the ion implantation process implants the second conductive type impurities to the implantation regions. The high voltage device 3 has the drift region 34b (as indicated by a thin dashed frame shown in FIG. 14E), which is located between the drain 35 and the gate 33, and separates the drain 35 and the gate 33. The drift region 34b has a length in the lateral direction (as indicated by a dashed arrow shown in FIG. 14E), wherein the length may be adjusted according to the operation voltage designed for normal operation. Part of the body region 37 is used as the channel region 34a (as indicated by a bold dashed frame shown in FIG. 14E).

Figure 15A:
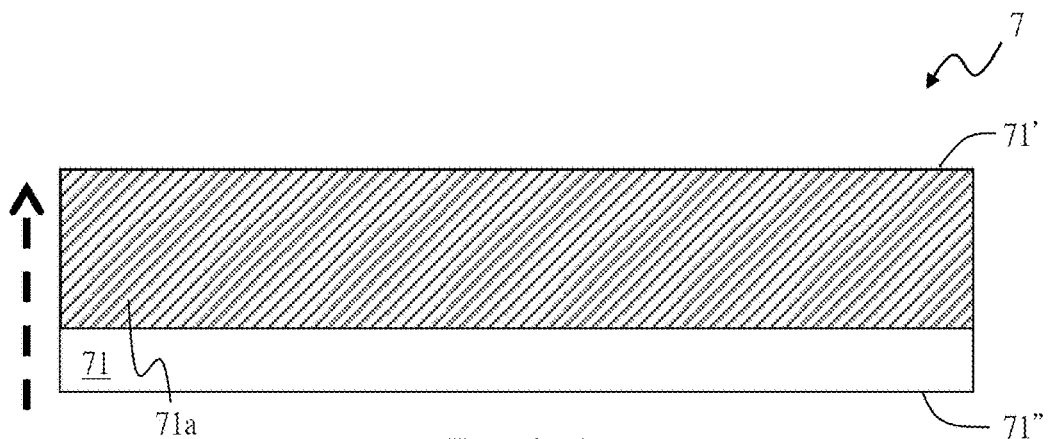
FIGS. 15A-15E show a tenth embodiment of the present invention.

FIGS. 15A-15E show a tenth embodiment of the present invention. This embodiment shows schematic diagrams in cross-section view, of a manufacturing method of the high voltage device 7 according to the present invention. As shown in FIG. 15A, the semiconductor substrate 71 is provided, wherein the semiconductor substrate 71 is for example but not limited to a P-type silicon substrate (or another type of semiconductor substrate in another embodiment). The semiconductor substrate 71 includes a top surface 71' and a bottom surface 71" opposite to the top surface 71' in the vertical direction (as shown by the bold dash arrow in FIG. 15A). Next, as shown in FIG. 15A, the high voltage well 71a is formed in the semiconductor substrate 71, wherein the high voltage well 71a is located beneath the top surface 71' and contacts the top surface 71a' in the vertical direction. The high voltage well 71a may be formed by for example but not limited to a method of a lithography process, an ion implantation process, and a thermal process as well known by those skilled in the art, so details thereof are omitted here. The drain 75, the drift region 74b, and at least part of the plug plate electrode 79 formed in later steps are located in the high voltage well 71a, wherein part of the high voltage well 71a is used as the drift region 74b.

Figure 15B:
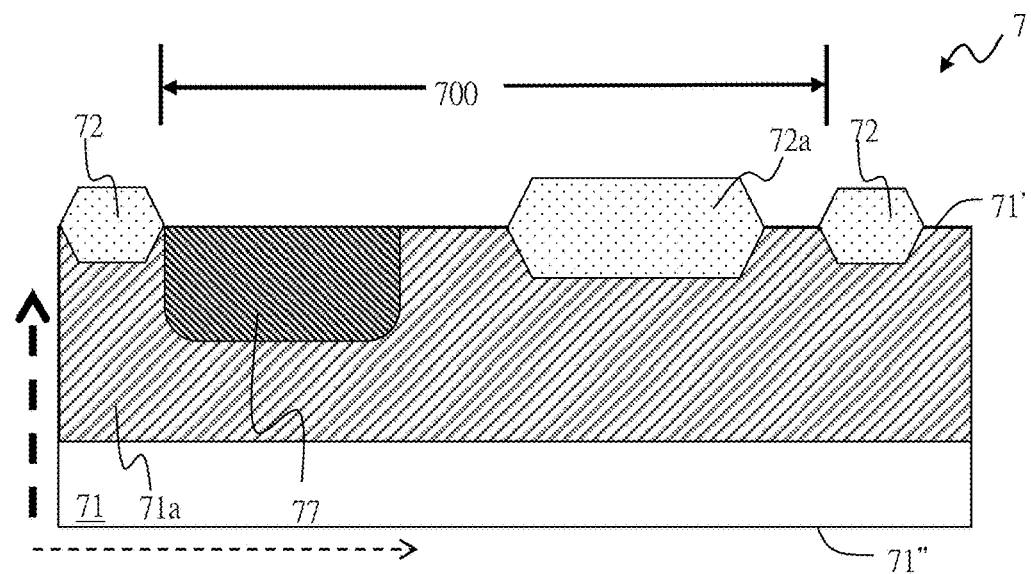

Next, as shown in FIG. 15B, the isolation structure 72 is formed in the semiconductor substrate 71 to define an operation region 700. In one embodiment, the isolation structure 72 is for example but not limited to the local oxidation of silicon (LOCOS) structure as shown in FIG. 15B, and in another embodiment, it can be the shallow trench isolation (STI) structure. In this embodiment, the isolation structure 72 and the field oxide region 72a are formed by a same process in the same time. Next, the body region 77 is formed in the semiconductor substrate 71. The body region 77 has the second conductive type. The body region 77 is located beneath the top surface 71' and contacts the top surface 71' in the vertical direction. The source 76 formed in a later process is located in the body region 77, wherein part of the body region 77 is used as the channel region 74a.

Figure 15C:
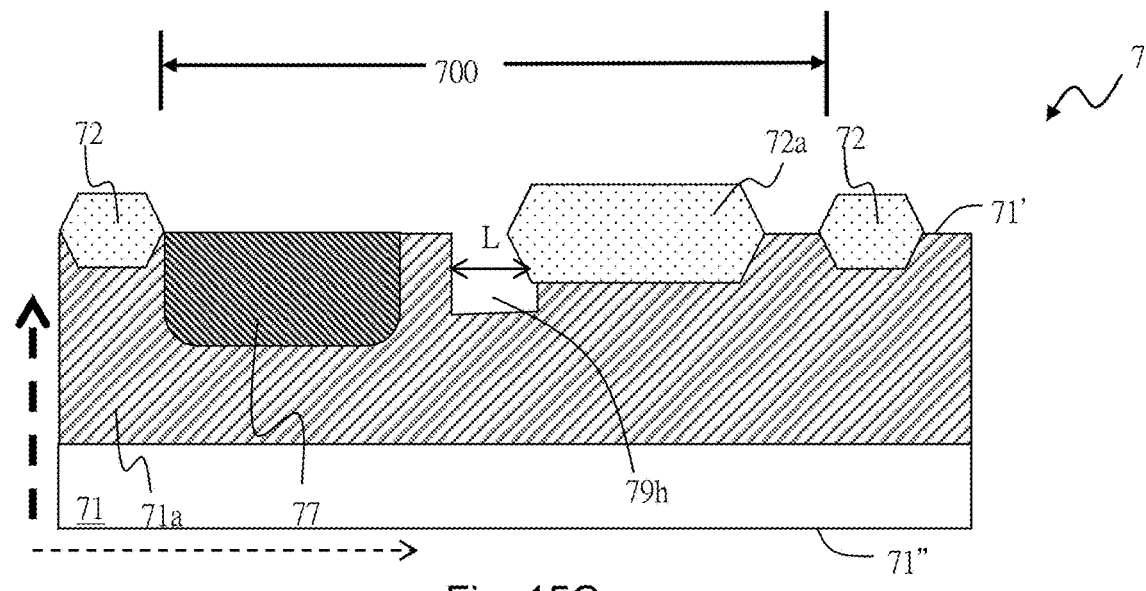
Figure 15D:
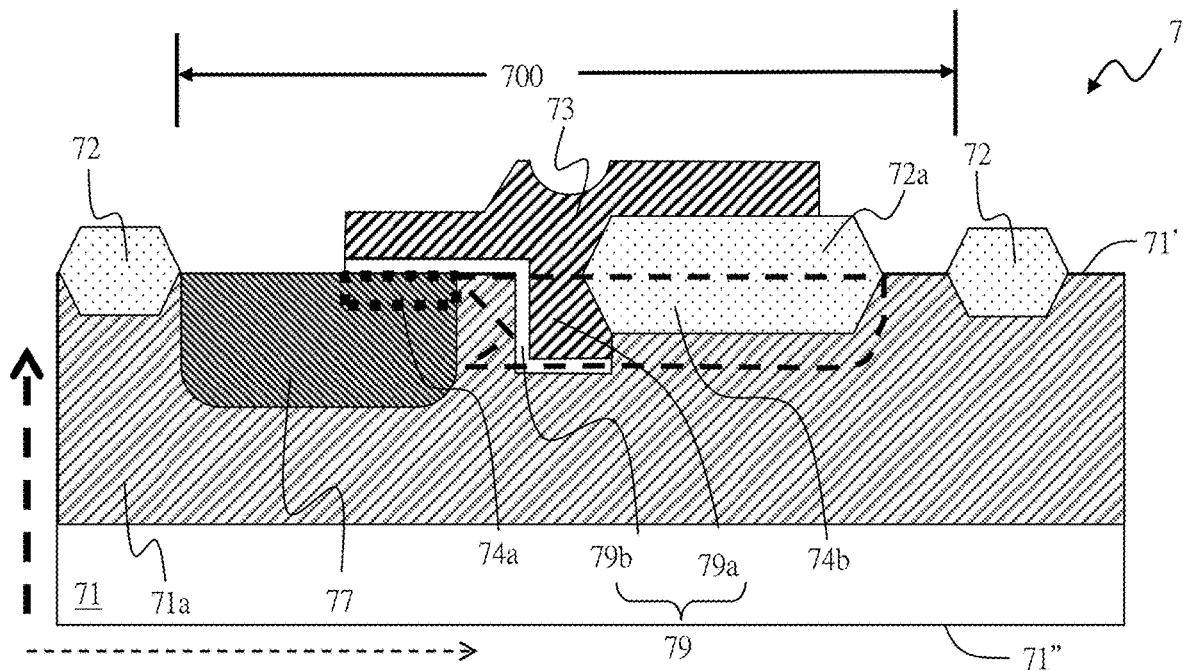

Next, as shown in FIG. 15C, the grooves 79h are formed in the semiconductor substrate 71. The grooves 79h may be formed by a lithography process and an etching process. The etching process etches the semiconductor substrate 71 but does not etch the filed oxide region 72a to form the groove 79h by the etching 39h selectivity of the etchant (different etching rates of the semiconductor substrate 71 and the field oxide region 72a). The groove 79h has the length L in the lateral direction. Next, as shown in FIG. 15D, the gate 73 is formed on the top surface 71' of the semiconductor substrate 71, and the gate 73 stacks on and contacts the top surface 71'; the gate 73 controls the high voltage device 7 to be ON or OFF according to a gate voltage applied on the gate 73. The lightly doped region 76a with the first conductive type is formed beneath the top surface 71' and contacts the top surface 71'. The lightly doped region 76a is located right below a spacer layer 76a of the gate 73. In this embodiment, the plug plate electrode 79 and the gate 73 may be formed at the same time with same process steps. That is, the dielectric layer 79a and the conductive layer 79b of the plug plate electrode 79, may be the same materials as the dielectric layer 73b and conductive layer 73c of the gate 73 respectively, and for example formed by same process steps of the dielectric layer 73b and conductive layer 73c of the gate 73. The dielectric layer 79a contacts the top surface 71', and the conductive layer 79b is electrically connected to the gate 73. In this embodiment, the conductive layer 79b and the conductive layer 73c are formed by the same process with the same material, and are electrically connected to each other. The at least one plug plate electrode 79 contacts the bottom of the gate 73 and is electrically connected to the gate 73; the plug plate electrode 79 extends downward from the bottom of the gate 73 into the semiconductor substrate 71. The downward extension extends by a vertical length which is longer than a "current vertical height" of a conductive current when the high voltage device 7 is ON. the plug plate electrode 79 is located between the source 76 and the drain 75 formed in later process in the lateral direction.

Figure 15E:
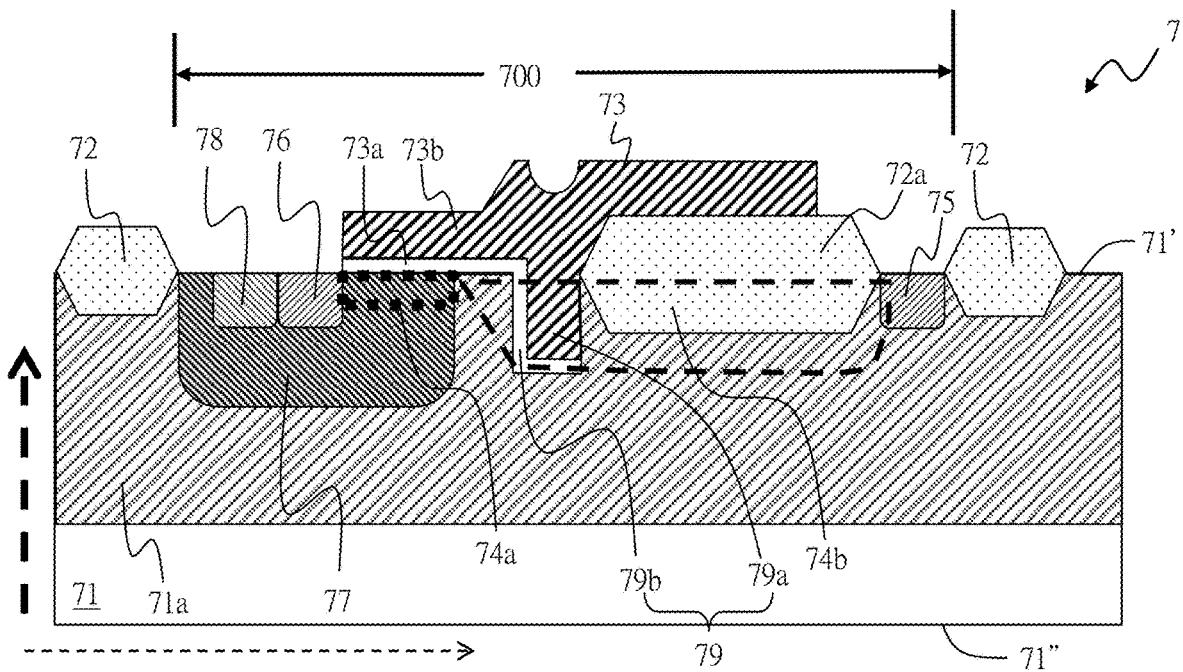

Next, as shown in FIG. 15E, the drain 75 and the source 76 are formed by the lithography process (including the self-alignment process) and the ion implantation process, wherein the lithography process defines the implantation regions by the photoresist mask together with the self-alignment effect provided by all or part of the gate 73 and the isolation structure 72, and the ion implantation process implants the first conductive type impurities to the implantation regions. The drain 75 and the source 76 are at different sides of and below the gate 73. Next, the body region 77 is formed by the lithography process (including the self-alignment process) and the ion implantation process, wherein the lithography process defines the implantation regions by a photoresist mask together with the self-alignment effect provided by all or a part of the gate 73 and the isolation structure 72, and the ion implantation process implants the second conductive type impurities to the implantation regions. The high voltage device 7 has the drift region 74b (as indicated by a thin dashed frame shown in FIG. 15E) which is located between the drain 75 and the gate 73, and separates the drain 75 and the gate 73. The drift region 74b has the length in the lateral direction (as indicated by a dashed arrow shown in FIG. 15E), wherein the length may be adjusted according to the operation voltage designed for normal operation. Part of the body region 77 is used as the channel region 74a (as indicated by a bold dashed frame shown in FIG. 15E).

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a deep well region, etc., can be added; for another example, the lithography process described in the above can be replaced by electron beam lithography or other lithography techniques. For another example, the conductive types of the P-type and the N-type of all the embodiments are interchangeable, with conductive type and/or impurity concentration modifications in other regions. For another example, it is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A high voltage device formed in a semiconductor substrate, wherein the semiconductor substrate has a top surface and a bottom surface opposite to the top surface in a vertical direction, the high voltage device comprising:
   a gate, which is formed on and contacts the top surface of the semiconductor substrate, and is configured to operably control the high voltage device to be ON or OFF according to a gate voltage;
   a source with a first conductive type, which is formed in the semiconductor substrate, and is located beneath the top surface and contacts the top surface in the vertical direction, and is located adjacent to a first side of the gate in a lateral direction;
   a drain with the first conductive type, which is formed in the semiconductor substrate, and is located beneath the top surface and contacts the top surface in the vertical direction, and is located outside a second side opposite to the first side of the gate in the lateral direction, wherein the drain is separated from the gate by a drift region in the lateral direction; and
   a plurality of plug plate electrodes, which contact a bottom of the gate and are electrically connected to the gate, and are located between the source and the drain in the lateral direction, the plural plug plate electrodes extending downward from the bottom of the gate into the semiconductor substrate, wherein the downward extensions extend by a vertical length which is longer than a current vertical height of a conductive current when the high voltage device is ON, wherein the current vertical height is a length of a vertical distribution of the conductive current;
   wherein the plug plate electrode includes a dielectric layer and a conductive layer, wherein the dielectric layer contacts the top surface, and the conductive layer is electrically connected to the gate;
   wherein the plural plug plate electrodes are arranged in parallel in a width direction, wherein each of the plug plate electrode is perpendicular to the width direction;
   wherein the conductive current flows through a spacing between the neighboring plug plate electrodes.

2. The high voltage device of claim 1, further comprising a field oxide region, which stacks on and contacts the top surface in the vertical direction, and at least part of the gate relatively nearer to the drain than the source stacks right above and contacts at least part of the field oxide region.

3. The high voltage device of claim 2, further comprising:
   a high voltage well with the first conductive type, which is formed in the semiconductor substrate, and is located beneath the top surface and contacts the top surface in the vertical direction, wherein the source, the drain, the drift region, and at least part of the plug plate electrode are located in the high voltage well, wherein part of the high voltage well is used as the drift region; and
   a body region with the second conductive type, which is formed in the semiconductor substrate, and is located beneath the top surface and contacts the top surface in the vertical direction, wherein the source is located in the body region, wherein part of the body region is used as a channel region.

4. The high voltage device of claim 3, wherein the plug plate electrode is entirely located in the high voltage well.

5. The high voltage device of claim 2, further comprising:
   a high voltage well with the second conductive type, which is formed in the semiconductor substrate, and is located beneath the top surface and contacts the top surface in the vertical direction, wherein part of the high voltage well is used as a channel region; and
   a drift well with the first conductive type, which is formed in the semiconductor substrate, and is located beneath the top surface and contacts the top surface in the vertical direction, wherein the drain is located in the drift well, wherein part of the drift well is used as the drift region.

6. The high voltage device of claim 5, wherein the plug plate electrode is entirely located in the high voltage well.

7. The high voltage device of claim 1, further comprising:
   a high voltage well with the first conductive type, which is formed in the semiconductor substrate, and is located beneath the top surface and contacts the top surface in the vertical direction, wherein the source, the drain, the drift region, and at least part of the plug plate electrode are located in the high voltage well, wherein part of the high voltage well is used as the drift region; and a body region with the second conductive type, which is formed in the semiconductor substrate, and is located beneath the top surface and contacts the top surface in the vertical direction, wherein the source is located in the body region, wherein part of the body region is used as a channel region.

8. The high voltage device of claim 7, wherein the plug plate electrode is entirely located in the high voltage well.

9. The high voltage device of claim 1, further comprising:
a high voltage well with the second conductive type, which is formed in the semiconductor substrate, and is located beneath the top surface and contacts the top surface in the vertical direction, wherein part of the high voltage well is used as a channel region; and
a drift well with the first conductive type, which is formed in the semiconductor substrate, and is located beneath the top surface and contacts the top surface in the vertical direction, wherein the drain is located in the drift well, wherein part of the drift well is used as the drift region.

10. The high voltage device of claim 9, wherein the plug plate electrode is entirely located in the high voltage well.

11. A manufacturing method of a high voltage device, comprising:
providing a semiconductor substrate, which includes a top surface and a bottom surface opposite to the top surface in a vertical direction;
forming a gate on the top surface of the semiconductor substrate, wherein the gate stacks on and contacts the top surface, and the gate is configured to operably control the high voltage device to be ON or OFF according to a gate voltage;
forming a plurality of plug plate electrodes, which contact a bottom of the gate and are electrically connected to the gate;
forming a source with a first conductive type in the semiconductor substrate, wherein the source is located beneath the top surface and contacts the top surface in the vertical direction, and is located adjacent to a first side of the gate in a lateral direction; and
forming a drain with the first conductive type in the semiconductor substrate, wherein the drain is located beneath the top surface and contacts the top surface in the vertical direction, and is located outside a second side opposite to the first side of the gate in the lateral direction, wherein the drain is separated from the gate by a drift region in the lateral direction;
wherein the plural plug plate electrodes extend downward from the bottom of the gate into the semiconductor substrate, wherein the downward extensions extend by a vertical length which is longer than a current vertical height of a conductive current when the high voltage device is ON, wherein the current vertical height is a length of a vertical distribution of the conductive current;
wherein the plug plate electrode includes a dielectric layer and a conductive layer, wherein the dielectric layer contacts the top surface, and the conductive layer is electrically connected to the gate;
wherein the plural plug plate electrodes are arranged in parallel in a width direction, wherein each of the plug plate electrode is perpendicular to the width direction;
wherein the conductive current flows through a spacing between the neighboring plug plate electrodes.

12. The manufacturing method of claim 11, further comprising forming a field oxide region, which stacks on and contacts the top surface in the vertical direction, and at least part of the gate relatively nearer to the drain than the source stacks right above and contacts at least part of the field oxide region.

13. The manufacturing method of claim 12, further comprising:
forming a high voltage well with the first conductive type in the semiconductor substrate, wherein the high voltage well is located beneath the top surface and contacts the top surface in the vertical direction, wherein the source, the drain, the drift region, and at least part of the plug plate electrode are located in the high voltage well, wherein part of the high voltage well is used as the drift region; and
forming a body region with the second conductive type in the semiconductor substrate, wherein the body region is located beneath the top surface and contacts the top surface in the vertical direction, wherein the source is located in the body region, wherein part of the body region is used as a channel region.

14. The manufacturing method of claim 13, wherein the plug plate electrode is entirely located in the high voltage well.

15. The manufacturing method of claim 12, further comprising:
forming a high voltage well with the second conductive type in the semiconductor substrate, wherein the high voltage well is located beneath the top surface and contacts the top surface in the vertical direction, wherein part of the high voltage well is used as a channel region; and
forming a drift well with the first conductive type in the semiconductor substrate, wherein the drift well is located beneath the top surface and contacts the top surface in the vertical direction, wherein the drain is located in the drift well, wherein part of the drift well is used as the drift region.

16. The manufacturing method of claim 15, wherein the plug plate electrode is entirely located in the high voltage well.

17. The manufacturing method of claim 11, further comprising:
forming a high voltage well with the first conductive type in the semiconductor substrate, wherein the high voltage well is located beneath the top surface and contacts the top surface in the vertical direction, wherein the source, the drain, the drift region, and at least part of the plug plate electrode are located in the high voltage well, wherein part of the high voltage well is used as the drift region; and
forming a body region with the second conductive type in the semiconductor substrate, wherein the body region is located beneath the top surface and contacts the top surface in the vertical direction, wherein the source is located in the body region, wherein part of the body region is used as a channel region.

18. The manufacturing method of claim 17, wherein the plug plate electrode is entirely located in the high voltage well.

19. The manufacturing method of claim 11, further comprising:
forming a high voltage well with the second conductive type in the semiconductor substrate, wherein the high voltage well is located beneath the top surface and contacts the top surface in the vertical direction, wherein part of the high voltage well is used as a channel region; and forming a drift well with the first conductive type in the semiconductor substrate, wherein the drift well is located beneath the top surface and contacts the top surface in the vertical direction, wherein the drain is located in the drift well, wherein part of the drift well is used as the drift region.

20. The manufacturing method of claim 19, wherein the plug plate electrode is entirely located in the high voltage well.

\* \* \* \* \*